(12) United States Patent
Sharma et al.

(10) Patent No.: US 9,319,059 B1
(45) Date of Patent: Apr. 19, 2016

(54) CALIBRATED SAR ADC HAVING A REDUCED SIZE

(71) Applicant: Texas Instruments Incorporated, Dallas, TX (US)

(72) Inventors: Ajit Sharma, Dallas, TX (US); Seung Bae Lee, Dallas, TX (US); Srinath Mathur Ramaswamy, Murphy, TX (US); Sriram Narayanan, Richardson, TX (US); Arup Polley, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/732,676

(22) Filed: Jun. 6, 2015

(51) Int. Cl.
*H03M 1/38* (2006.01)
*H03M 1/46* (2006.01)
*H03M 1/10* (2006.01)
*H03M 1/40* (2006.01)

(52) U.S. Cl.
CPC ............ *H03M 1/466* (2013.01); *H03M 1/1028* (2013.01); *H03M 1/38* (2013.01); *H03M 1/403* (2013.01); *H03M 1/46* (2013.01)

(58) Field of Classification Search
CPC ..... H03M 1/466; H03M 1/1028; H03M 1/38; H03M 1/403; H03M 1/46
USPC .......................................... 341/155, 161, 120
See application file for complete search history.

(56) References Cited

U.S. PATENT DOCUMENTS

| | | | |
|---|---|---|---|
| 7,663,518 B2 * | 2/2010 | Hurrell ............... | H03M 1/0641 341/131 |
| 7,755,521 B1 * | 7/2010 | Kuramochi ......... | H03M 1/1061 341/118 |
| 8,519,874 B2 * | 8/2013 | Aruga ................. | H03M 1/1019 341/120 |
| 8,665,125 B2 * | 3/2014 | Reinhold ............ | H03M 1/1061 341/120 |

* cited by examiner

*Primary Examiner* — Brian Young
(74) *Attorney, Agent, or Firm* — John R. Pessetto; Frank D. Cimino

(57) ABSTRACT

The silicon real estate required for the semiconductor fabrication of a calibrated capacitor-based successive approximation register (SAR) analog-to-digital converter (ADC) (100) is substantially reduced by using a number of shared capacitors (SC1-SCs–1) which are used as calibration capacitors when operating in a calibration mode and as bit capacitors when operating in a normal mode.

18 Claims, 15 Drawing Sheets

CALIBRATED SAR ADC HAVING A REDUCED SIZE

BACKGROUND OF THE INVENTION

1. Field of the Invention

The present invention relates to a successive approximation register (SAR) analog-to-digital converter (ADC) and, more particularly, to a calibrated SAR ADC that has a reduced size.

2. Description of the Related Art

Current-generation integrated circuits often include both analog and digital circuits. An analog-to-digital converter (ADC) is an electronic circuit that converts an analog signal into a digital word that represents the analog signal so that the analog signal can be processed by a digital circuit. One well-known type of ADC is a successive approximation register (SAR) ADC.

A SAR ADC includes a digital-to-analog converter (DAC), which is commonly implemented with a series of capacitors and a number of switches. The capacitors have top plates that are connected together, and bottom plates that are individually connectable by way of the switches to an input voltage, a reference voltage, and ground.

The capacitors include a number of binary-valued capacitors, such as 1C, 2C, 4C, 8C, and 16C, where 1C represents the capacitance and plate area of the smallest capacitor that can be fabricated with a given process. A 16C capacitor has 16× the capacitance and plate area of the 1C capacitor, while an 8C capacitor has 8× the capacitance and plate area of the 1C capacitor.

The binary-valued capacitors include a 1C dummy capacitor that allows the capacitor values to be evenly divided. For example, the first four binary-valued capacitors (1C, 2C, 4C, 8C) in combination with the 1C dummy capacitor have a total capacitance of 16C, which is equal to the fifth binary-valued capacitor (16C). Similarly, the first three binary-valued capacitors (1C, 2C, 4C) in combination with the 1C dummy capacitor have a total capacitance of 8C, which is equal to the fourth binary-valued capacitor (8C).

Each of the binary-valued capacitors, with the exception of the dummy capacitor, corresponds to a bit in the digital word output by the SAR ADC. For example, a SAR ADC that outputs a five-bit word typically has six binary-valued capacitors, five bit capacitors and one dummy capacitor.

The largest binary-valued capacitor (16C in the present example) represents the most significant bit (MSB), while the smallest binary-valued capacitor (1C in the present example) represents the least significant bit (LSB). In addition to the capacitive-based DAC, a SAR ADC also includes a comparator and a controller.

In operation, the capacitive-based DAC receives a sequence of control words from the controller, which controls the positions of the switches which, in turn, determine whether the input voltage, the reference voltage, or ground is connected to the binary-weighted capacitors.

The sequence of connecting and reconnecting the voltages generates a sequence of DAC voltages at the input of the comparator, which compares the sequence of DAC voltages to ground, and outputs a sequence of logic values that represents the results of the comparisons. The controller interprets the sequence of logic values, and sequentially assigns a logic state to each bit position in the digital word that represents the input voltage.

A high-resolution SAR ADC can be formed by increasing the number of bits within the digital word that represents the input voltage. For example, a SAR ADC that outputs a 10-bit word has a much higher resolution than a SAR ADC that outputs a 5-bit word. However, as the number of bits increase, the size of the largest binary-valued capacitor significantly increases. The largest capacitor in a 5-bit word is 16× larger than the smallest capacitor, whereas the largest capacitor in a 10-bit word is 1024× larger.

One approach to reducing the size of a high-resolution SAR ADC is to use a segmented capacitor-based DAC. In the smallest segmented capacitor-based DAC, a first group of capacitors and switches are used to form a main DAC, while a second group of capacitors and switches are used to form a sub DAC that is connected to the main DAC by an attenuating capacitor.

For example, the main DAC can include a number of binary-valued capacitors, such as 1C, 2C, 4C, 8C, and 16C, while the sub DAC can include a number of binary-valued capacitors, such as 1C, 2C, and 4C. The attenuating capacitor reduces the effect of the capacitors in the sub DAC so that the 4C capacitor in the sub DAC has the effect of a 1/2C capacitor, the 2C capacitor in the sub DAC has the effect of the 1/4C capacitor, and the 1C capacitor in the sub DAC has the effect of the 1/8C capacitor. Thus, in the present example, an 8-bit DAC formed with a main DAC and a sub DAC can be formed in a much smaller area than an 8-bit DAC that is formed with 1C, 2C, 4C, 8C, 16C, 32C, 64C, and 128C.

SUMMARY OF THE INVENTION

The present invention is a SAR ADC that has a reduced size. The SAR ADC includes a DAC that has a capacitor array. The capacitor array has a plurality of segments, and a number of attenuation capacitors that are connected to the plurality of segments such that an attenuation capacitor is connected to and between each adjacent pair of segments. The plurality of segments includes a main DAC segment that has a number of binary-weighted main conversion capacitors. None of the number of binary-weighted main conversion capacitors has substantially identical weights. The plurality of segments also includes one or more sub-DAC segments that have a number of binary-weighted sub-DAC capacitors. One sub-DAC segment has three binary-weighted sub-DAC capacitors that have substantially identical weights. The SAR ADC also includes a comparator that is connected to the DAC, and a controller that is connected to the DAC and the comparator.

The present invention also includes a method of calibrating a SAR ADC. The method includes closing a ground switch, and connecting a reference voltage to a first selected number of capacitors of a plurality of capacitors, and ground to a first remaining number of capacitors of the plurality of capacitors. The first number of capacitors excludes a main conversion capacitor that is being calibrated, and any previous main conversion capacitors that have been calibrated. Each of the plurality of capacitors has a specified capacitance. A sum of the specified capacitances of the first selected number of capacitors adds up to a first value. The method also includes opening the ground switch after the reference voltage has been connected to the first selected number of capacitors, and ground to the first remaining number of capacitors. The method further includes connecting the reference voltage to a second selected number of capacitors of the plurality of capacitors, and ground to a second remaining number of capacitors of the plurality of capacitors to generate a first DAC voltage after the ground switch has been opened. The second selected number of capacitors includes the main conversion capacitor that is being calibrated, and excludes any previous main conversion capacitors that have been calibrated. A sum of the specified capacitances of the second selected number of capacitors adds up to a second value that is equal to the first value.

The present invention also includes a method of operating a SAR ADC. The method includes first determining a logic value for a most significant bit (MSB) within a digital word. The first determining includes connecting an input voltage to a first plurality of capacitors. The first plurality of capacitors include a plurality of main conversion capacitors, a plurality of sub-conversion capacitors, and a plurality of shared capacitors. The first determining also includes connecting a reference voltage to a second plurality of capacitors. The second plurality of capacitors include a main conversion capacitor of the plurality of main conversion capacitors, and a first selected number of shared capacitors of the plurality of shared capacitors to generate a MSB DAC voltage. The method also includes second determining a logic value for a least significant bit (LSB) within the digital word. The second determining includes connecting the reference voltage to a second selected number of shared capacitors from the plurality of shared capacitors to generate a LSB DAC voltage.

A better understanding of the features and advantages of the present invention will be obtained by reference to the following detailed description and accompanying drawings which set forth an illustrative embodiment in which the principals of the invention are utilized.

DETAILED DESCRIPTION OF THE INVENTION

Figure 1:
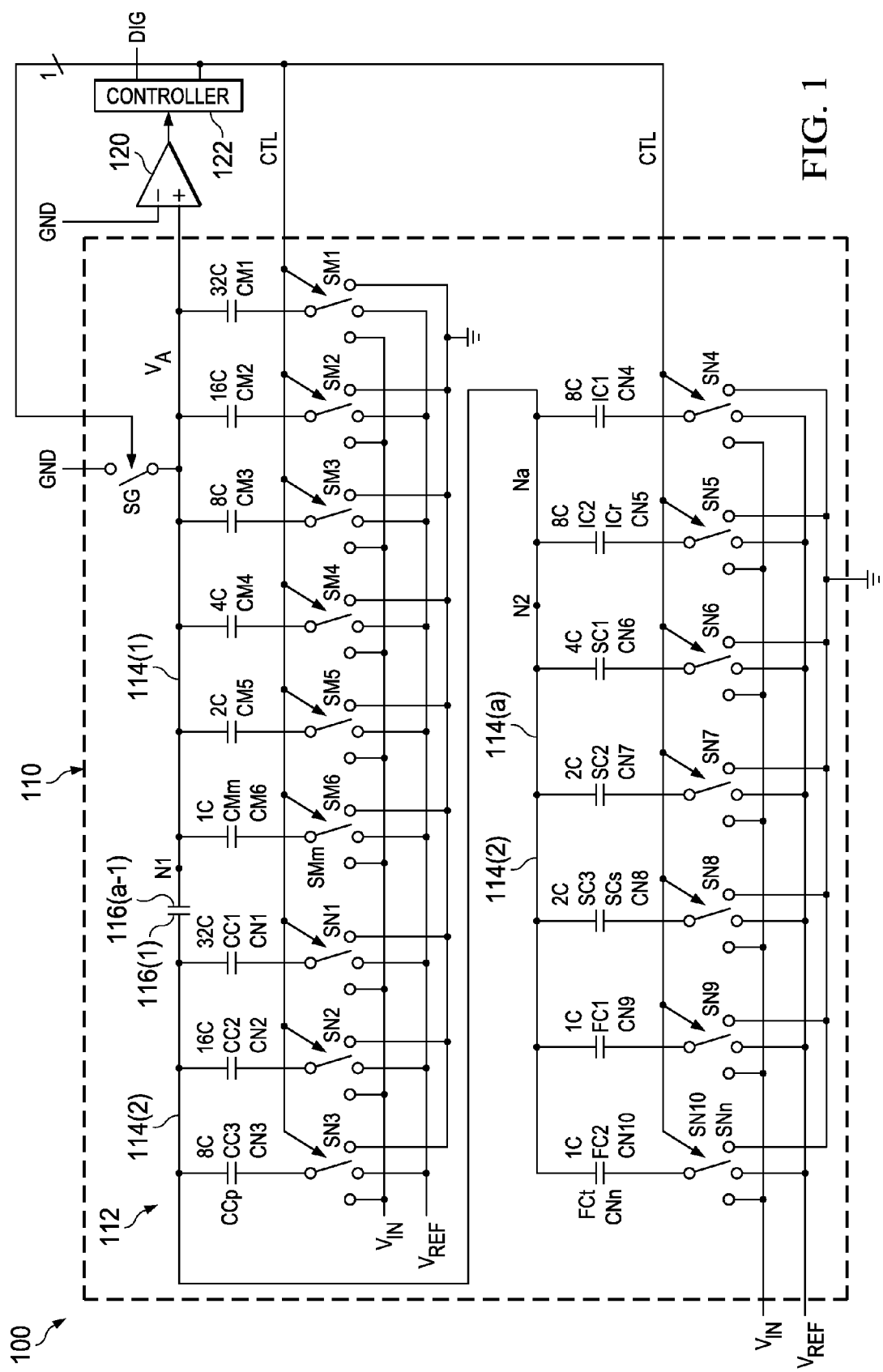
FIG. 1 is a circuit diagram illustrating an example of a calibrated successive approximation register (SAR) analog-to-digital converter (ADC) 100 in accordance with the present invention.

FIG. 1 shows a circuit diagram that illustrates an example of a calibrated successive approximation register (SAR) analog-to-digital converter (ADC) 100 in accordance with the present invention. As described in greater detail below, SAR ADC 100 integrates a sub-DAC circuit and a calibration circuit to substantially reduce the silicon real estate that is required to implement the converter.

As shown in FIG. 1, SAR ADC 100 includes a digital-to-analog converter (DAC) 110 that is connected to receive an input voltage VIN, a reference voltage VREF, and ground. In addition, DAC 110 is connected to receive a sequence of control words CTL that select between the input voltage VIN, the reference voltage VREF, and ground. Further, DAC 110 generates a sequence of DAC voltages VA, where the DAC voltages VA vary over time in response to changes in the voltages VIN, VREF, and ground, which are selected by the sequence of control words CTL.

DAC 110 includes a segmented capacitor array 112 that has two or more segments 114(1)-114(a) connected in series, and one or more attenuation capacitors 116(1)-116(a−1) that are connected to the segments 114 such that an attenuation capacitor 116 is connected to and between each adjacent pair of segments 114. The two or more segments 114(1)-114(a) include a main DAC segment 114(1) with a main node N1, and one or more sub-DAC segments 114(2)-114(a) with one or more sub-nodes N2-Na.

In the FIG. 1 example, DAC 110 has two segments 114: main DAC segment 114(1) with main node N1, and one sub-DAC segment 114(2) with one sub-node N2, along with one attenuation capacitor 116(1) that is connected to and between the pairs of adjacent sub-DAC segments 114(1) and 114(2). DAC 110 also includes a ground switch SG that is connected to and between a sub-DAC segment 114, which in the present example is main DAC segment 114(1), and ground.

Main DAC segment 114(1) has a number of binary-weighted main conversion capacitors CM1-CMm, where none of the binary-weighted main conversion capacitors CM have substantially identical weights. In addition, main DAC segment 114(1) has a number of main switches SM1-SMm that are connected to the main conversion capacitors CM1-CMm.

Each of the main conversion capacitors CM has a first plate that is connected to the main node N1, and a second plate that is connected to a main switch SM. Each main switch SM, in turn, can be connected to receive the input voltage VIN, the reference voltage VREF, or ground. Each main switch SM is also connected to receive the sequence of control words CTL, which selects the voltage VIN, VREF, or ground that is to be placed on the second plates of the main conversion capacitors CM.

In the FIG. 1 example, the binary-weighted main conversion capacitors CM include six capacitors CM1-CM6, i.e., m=6, which have the following weights: CM1-32C, CM2-16C, CM3-8C, CM4-4C, CM5-2C, and CM6-1C, where 1C represents the capacitance and plate area of the smallest capacitor that can be fabricated with a given process.

Unlike main DAC segment 114(1), the sub-DAC segments 114(2)-114(a) have a number of binary-weighted sub-DAC capacitors CN1-CNn, where one of the sub-DAC segments 114(2)-114(a) has three binary-weighted sub-DAC capacitors CN that have substantially identical weights. In addition, the sub-DAC segments 114(2)-114(a) have a number of sub-switches SN1-SNn that are connected to the binary-weighted sub-DAC capacitors CN1-CNn.

Each of the sub-DAC capacitors CN has a first plate that is connected to a sub-node N2-Na, and a second plate that is connected to a sub-switch SN. Each sub-switch SN, in turn, can be connected to receive the input voltage VIN, the reference voltage VREF, or ground. Each sub-switch SN is also connected to receive the sequence of control words CTL, which selects the voltage VIN, VREF, or ground that is to be placed on the second plates of the sub-DAC capacitors CN.

In the FIG. 1 example, the binary-weighted sub-DAC capacitors CN include ten capacitors CN1-CN10, i.e., n=10, which have the following weights: CN1-32C, CN2-16C, CN3-8C, CN4-8C, CN5-8C, CN6-4C, CN7-2C, CN8-2C, CN9-1C, and CN10-1C. Thus, in the present example, the three sub-DAC capacitors CN with substantially the same weight are sub-DAC capacitors CN3, CN4, and CN5.

The number of binary-weighted sub-DAC capacitors CN1-CNn includes a number of sub-conversion capacitors CC1-CCp, a number of integer calibration capacitors IC1-ICr, a number of shared capacitors SC1-SCs, and a number of fractional calibration capacitors FC1-FCf. The symbols a, p, r, s, and f represent an integer that is greater than zero.

In the FIG. 1 example, the sub-DAC capacitors CN1-CN3 are the sub-conversion capacitors CC1-CCp, i.e., p=3, the sub-DAC capacitors CN4-CN5 are the integer calibration capacitors IC1-ICr, i.e., r=2, the sub-DAC capacitors CN6-CN8 are the shared capacitors SC1-SCs, i.e., s=3, and the sub-DAC capacitors CN9-CN10 are the fractional calibration capacitors FC1-FCf, i.e., f=2.

As additionally shown in FIG. 1, SAR ADC 100 also includes a comparator 120 and a controller 122. Comparator 120 has a first input connected to the main node N1, a second input connected to a control voltage, such as ground, and an output. Comparator 120 compares the voltages on the first and second inputs, and generates a sequence of logic values that depend on the results of the comparisons.

Controller 122, which controls the operation of SAR ADC 100, is connected to ground switch SG, the main switches SM1-SMm, the sub-switches SN1-SNn, and comparator 120. In addition, controller 122 determines the logic states of the bits within a digital word DIG that represents a sampled portion of the input voltage VIN in response to the sequence of logic values generated by comparator 120, and outputs the digital word DIG.

Attenuation capacitor 116(1), in turn, is connected to and between main node N1 and sub-node N2. The attenuation capacitors 116(1)-116(a-1) reduce the capacitances of the capacitors in the sub-DAC segments 114(2)-114(a) which, in turn, allows smaller capacitor arrays to be used to implement a series of binary-weighted capacitors.

Figure 2:
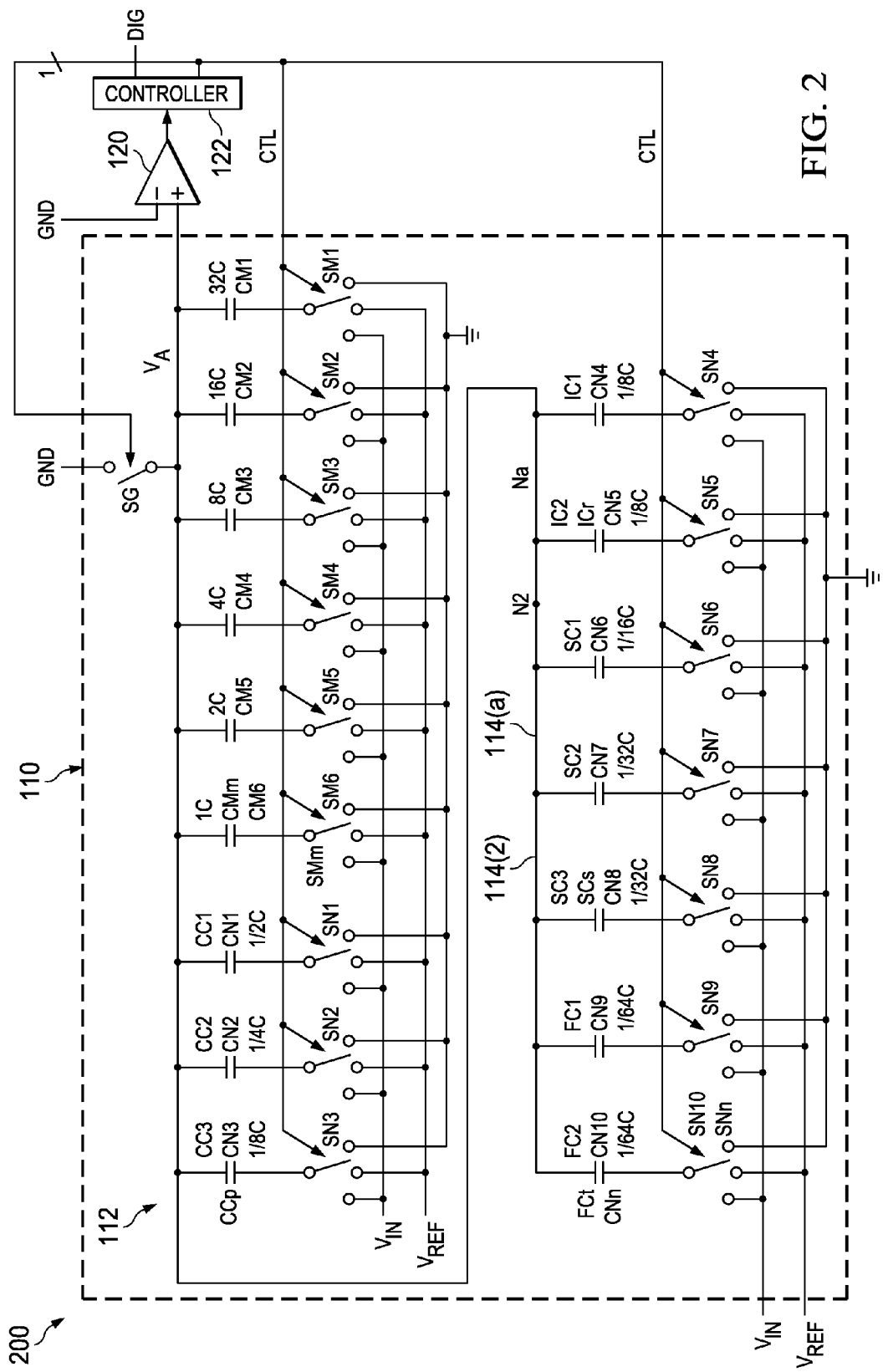
FIG. 2 is a circuit diagram illustrating an example of a calibrated successive approximation register (SAR) analog-to-digital converter (ADC) 200 in accordance with the present invention.

FIG. 2 shows a circuit diagram that illustrates an example of a calibrated successive approximation register (SAR) analog-to-digital converter (ADC) 200 in accordance with the present invention. SAR ADC 200 is electrically equivalent to SAR ADC 100, and illustrates the effect of attenuation capacitor 116(1).

As shown in FIGS. 1 and 2, attenuation capacitor 116(1) effectively reduces the weights of the sub-DAC capacitors CN by 1/64 so that the ten sub-DAC capacitors CN1-CN10 have the following effective weights: CN1-1/2C, CN2-1/4C, CN3-1/8C, CN4-1/8C, CN5-1/8C, CN6-1/16C, CN7-1/32C, CN8-1/32C, CN9-1/64C, and CN10-1/64C.

SAR ADC 100 and SAR ADC 200 have two modes of operation: a calibration mode and a normal mode. The calibration mode determines the calibration conditions that are used to compensate for variations between the values specified for the main conversion capacitors CM1-CMm and the actual values of the main conversion capacitors CM1-CMm.

When in the calibration mode, controller 122 executes a calibration binary search algorithm that generates a sequence of control words CTL. The sequence of control words CTL connect the main conversion capacitors CM1-CMm, the sub-conversion capacitors CC1-CCp, the integer calibration capacitors IC1-ICr, the shared capacitors SC1-SCs, and the fractional calibration capacitors FC1-FCf via the switches SM and SN to either the reference voltage VREF or ground, which generates the sequence of DAC voltages VA.

Comparator 120 compares the sequence of DAC voltages VA to a control voltage, such as ground, and outputs a sequence of logic values that represent the results of the comparisons. Controller 122 interprets the sequence of logic values, and determines the calibration conditions for the main conversion capacitor CM that is being calibrated. Controller 122 includes a memory that stores the calibration conditions.

The normal mode determines the digital word DIG, which represents a sampled portion of the input voltage VIN. When in the normal mode of operation, controller 122 executes an ADC binary search algorithm that generates a sequence of search words, which are modified by the calibration conditions, to output the sequence of control words CTL.

The sequence of control words CTL connect the main conversion capacitors CM1-CMm, the sub-conversion capacitors CC1-CCp, the integer calibration capacitors IC1-ICr, the shared capacitors SC1-SCs, and the fractional calibration capacitors FC1-FCf via the switches SM and SN between the input voltage VIN, the reference voltage VREF, and ground, which generates the sequence of DAC voltages VA.

Comparator 120 compares the DAC voltage VA to a control voltage, such as ground, and outputs a sequence of logic values that represent the results of the comparisons. Controller 122 interprets the sequence of logic values, and sequentially assigns a logic value to each bit in the digital word DIG. Controller 122 includes a memory that stores the digital word DIG.

The binary-weighted main conversion capacitors CM1-CM6 correspond to the most significant bits in the digital word DIG output by SAR ADC 100/200, with CM1 representing the most significant bit MSB of the digital word DIG, CM2 representing MSB-1 of the digital word DIG, and CM6 representing MSB-5 of the digital word DIG. The binary-weighted sub-conversion capacitors CC1-CCp (CN1-CN3) correspond to the next three bits in the digital word DIG, with CN1 representing MSB-6 of the digital word DIG and CN3 representing MSB-8 of the digital word DIG.

The binary-weighted shared capacitors SC1-SC2 (CN6-CN7) correspond to the last two bits in the digital word DIG, with CN6 representing MSB-9 and CN7 representing MSB-10, which is also the least significant bit (LSB) of the digital word DIG. The shared capacitors SC1-SCs-1 are part of the digital word DIG, but are also used to apply the calibration conditions to the main conversion capacitors CM1-CMm.

In operation, SAR ADC 100 first calibrates the MSB capacitor CM1 to determine the calibration conditions for the MSB capacitor CM1 (which compensates for differences between the specified value and the actual value of the MSB capacitor CM1). Once the calibration conditions for the MSB capacitor CM1 have been determined, SAR ADC calibrates the MSB-1 capacitor CM2 to determine the calibration conditions for the MSB-1 capacitor CM2 (which compensate for differences between the specified value and the actual value of the MSB-1 capacitor CM2). The process continues until the calibration conditions have been determined for all of the main conversion capacitors CM1-CMm. (The sub-conversion capacitors CC1-CCp are not calibrated because any error from these capacitors is very small.)

Figure 3:
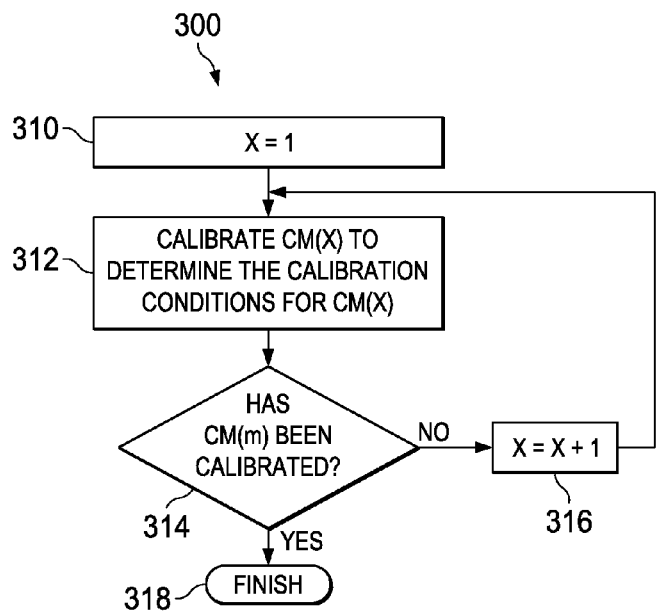
FIG. 3 is a flow chart illustrating an example of a method 300 of calibrating SAR ADC 100 in accordance with the present invention.

FIG. 3 shows a flow chart that illustrates an example of a method 300 of calibrating SAR ADC 100 in accordance with the present invention. Method 300 begins at 310 by setting a variable X to 1, then moving to 312 to calibrate main conversion capacitor CM1 and determine the calibration conditions for main conversion capacitor CM1.

Method 300 next moves to 314 to determine if the last main conversion capacitor CMm has been calibrated. If not, method 300 moves to 316 to increment the variable X, and then back to 312 to determine the calibration conditions for the next main conversion capacitor CM. When last main conversion capacitor CMm has been calibrated, method 300 moves to 318 to finish.

Thus, SAR ADC 100 selects a main conversion capacitor, and determines the calibration conditions for the selected main conversion capacitor CM. SAR ADC 100 then selects a next main conversion capacitor, determines the calibration conditions for the next selected main conversion capacitor CM, and continues until the calibration conditions have been determined for each main conversion capacitor.

Figure 4B:
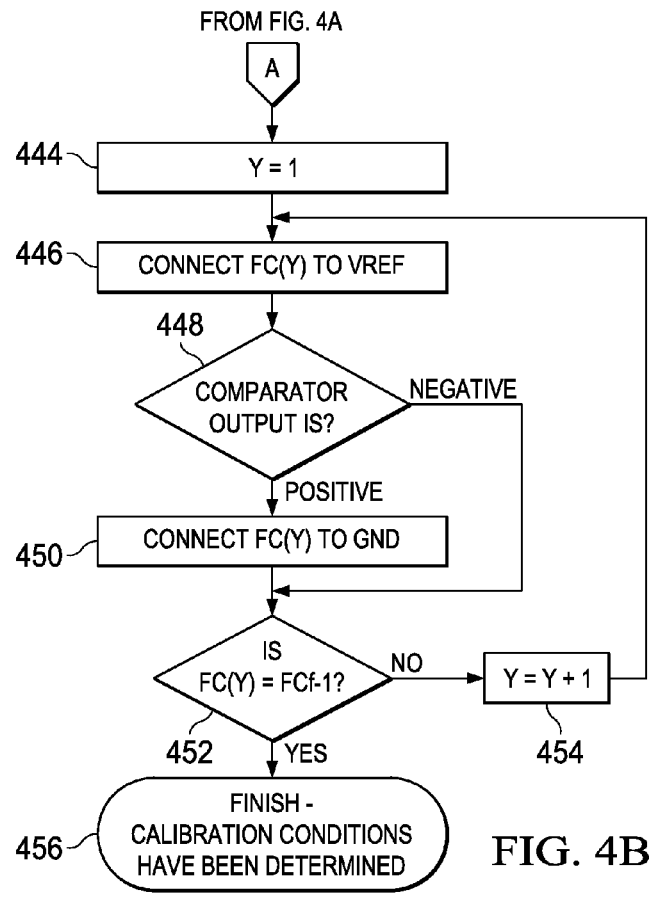
FIGS. 4A-4B are a flow chart illustrating an example of a method 400 of determining the calibration conditions for a selected main conversion capacitor in accordance with the present invention.
Figure 4A:
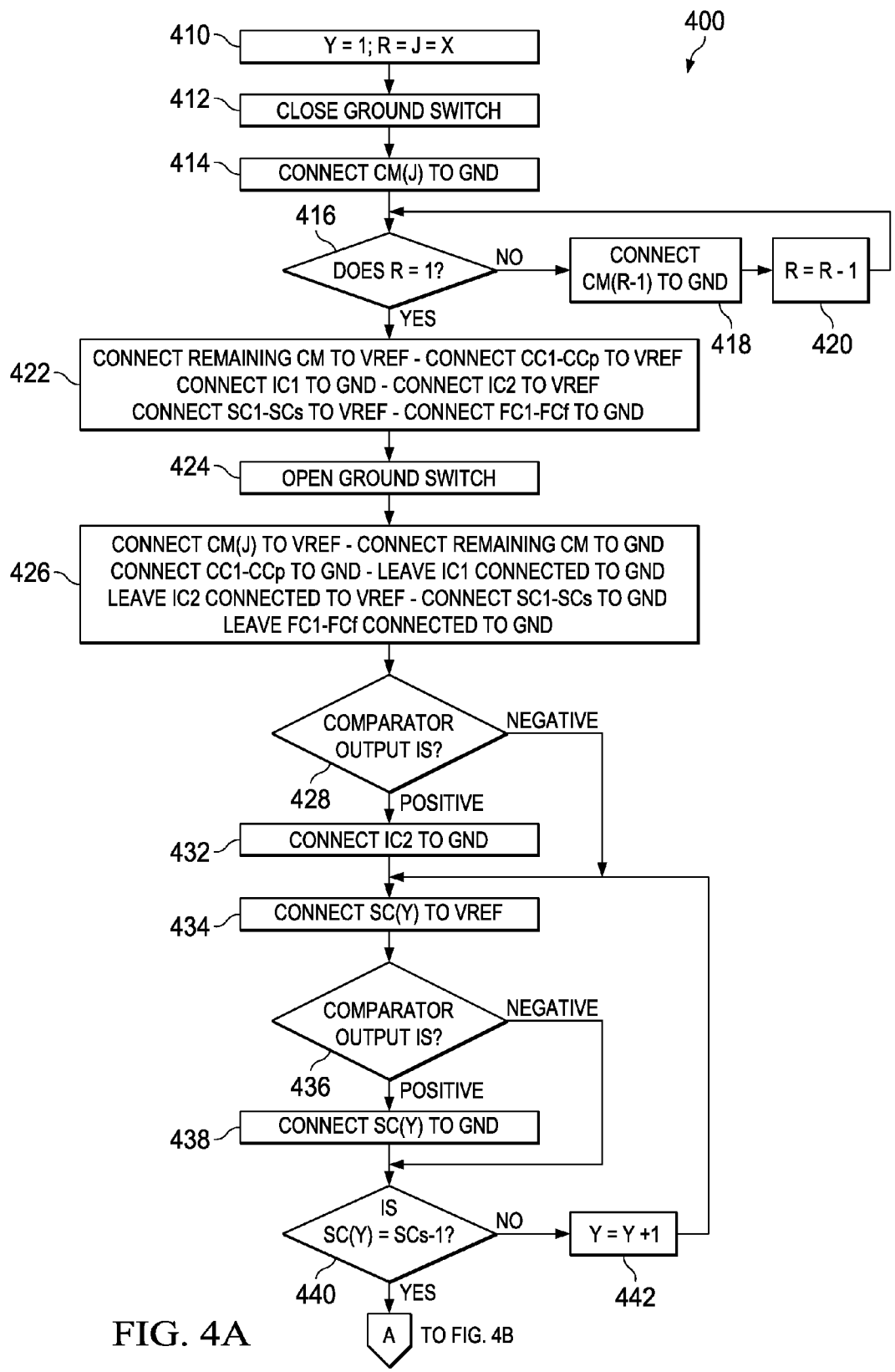

FIGS. 4A-4B show a flow chart that illustrates an example of a method 400 of determining the calibration conditions for a selected main conversion capacitor in accordance with the present invention. As shown in the FIGS. 4A-4B example, method 400 begins at 410 by setting a variable Y to be equal to one, and a variable R and a variable J to be equal to the variable X (which in FIG. 3 identifies the selected main conversion capacitor CM), then moves to 412 to close the ground switch SG.

After the ground switch SG has been closed, method 400 next moves to 414 to connect the second plate of the selected main conversion capacitor CM to ground. Following this, method 400 loops through 416, 418, and 420 until the second plates of all of the previously calibrated main conversion capacitors CM have been grounded.

Once all of the previously calibrated main conversion capacitors CM have been grounded, method 400 moves from 416 to 422 to connect the second plates of the remaining main conversion capacitors CM to the reference voltage VREF. In addition, method 400 connects the second plates of the sub-conversion capacitors CC1-CCp (e.g., CC1-CC3) to the reference voltage, the second plate of the integer calibration capacitor IC1 to ground, and the second plate of the integer calibration capacitor IC2 to the reference voltage VREF. Further, method 400 connects the second plates of the shared capacitors SC1-SCs (e.g., SC1-SC3) to the reference voltage VREF, and the second plates of the fractional calibration capacitors FC1-FCf (e.g., FC1-FC2) to ground.

Figure 5:
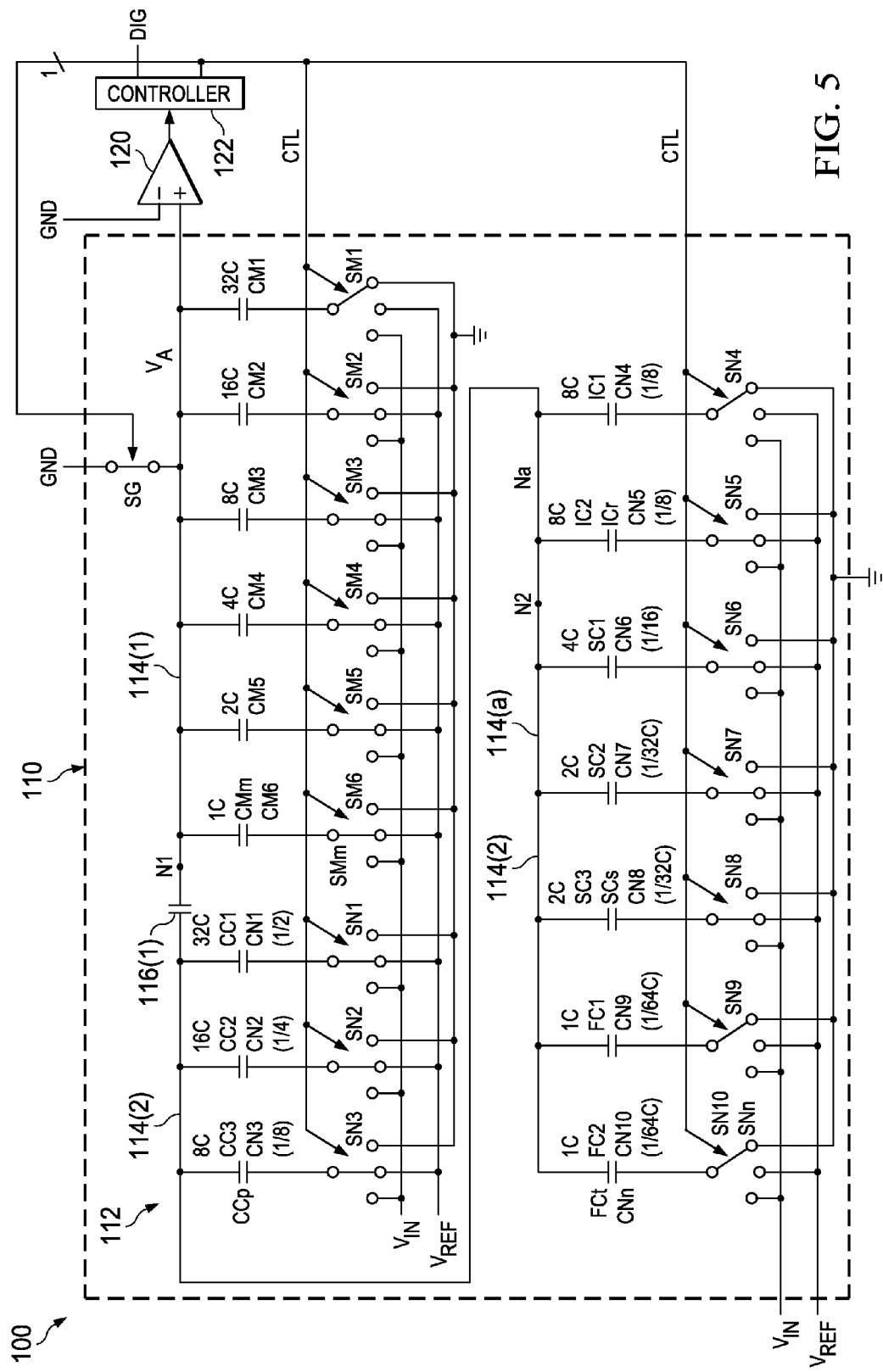
FIG. 5 is a circuit diagram illustrating an example of SAR ADC 100 following 422 in FIGS. 4A-4B in accordance with the present invention.

FIG. 5 shows a circuit diagram that illustrates an example of SAR ADC 100 following 422 in accordance with the present invention. In the FIG. 5 example, the selected main conversion capacitor CM is capacitor CM1. As shown in FIG. 5, ground switch SG has been closed, the selected main conversion capacitor CM1 has been grounded, and the second plates of the remaining main conversion capacitors CM2-CM6 are connected to the reference voltage VREF.

In addition, the second plates of the sub-conversion capacitors CC1-CC3 (CC1-CCp) are connected to the reference voltage VREF, the second plate of the integer calibration capacitor IC1 is connected to ground, and the second plate of the integer calibration capacitor IC2 is connected to the reference voltage VREF. Further, the second plates of the shared capacitors SC1-SC3 (SC1-SCs) are connected to the reference voltage VREF, and the second plates of the fractional capacitors FC1-FC2 (FC1-FCf) are connected to ground.

Connecting the main conversion capacitors CM1-CMm and the sub-DAC capacitors CN1-CNn as illustrated in FIG. 5 example places a negative charge on the first plates of the capacitors that are connected to the reference voltage VREF. As is well known in the art, the charge equals the sum of the specified capacitances of the capacitors CM1-CMm and CN1-CNn that are connected to the reference voltage VREF, multiplied times the reference voltage VREF. In the FIG. 1 example, the sum of the specified capacitances of the capacitors CM2-CM6, CN1-CN4, and CN6-CN10 that are connected to the reference voltage VREF is equal to 32 1/8C.

Thus, method 400 connects the reference voltage VREF to the second plates of a first number of capacitors of the capacitors CM1-CMm and CN1-CNn, and ground to the remaining number of capacitors of the capacitors CM1-CMm and CN1-CNn. The first number of capacitors excludes the main conversion capacitor that is being calibrated, and any previous main conversion capacitors that have been calibrated. The sum of the specified capacitances of the first number of capacitors adds up to a first value.

Returning to FIGS. 4A-4B, after the connections have been made, method 400 moves from 422 to 424 to open the ground switch SW, and then to 426 to connect the second plate of the selected main conversion capacitor CM to the reference voltage VREF, and connect the second plates of the remaining main conversion capacitors CM to ground.

In addition, method 400 connects the second plates of the sub-conversion capacitors CC1-CCp (CC1-CC3) to ground, connects the integer calibration capacitor IC1 to ground (leaves the integer calibration capacitor IC1 connected to ground), and connects the integer calibration capacitor IC2 to the reference voltage VREF (leaves the integer calibration capacitor IC2 connected to the reference voltage VREF). Further, method 400 connects the second plates of the shared capacitors SC1-SCs (SC1-SC3) to ground, and connects the second plates of the fractional calibration capacitors FC1-FCf (FC1-FC2) to ground (leaves the fractional calibration capacitors FC1-FCf connected to ground).

Figure 6:
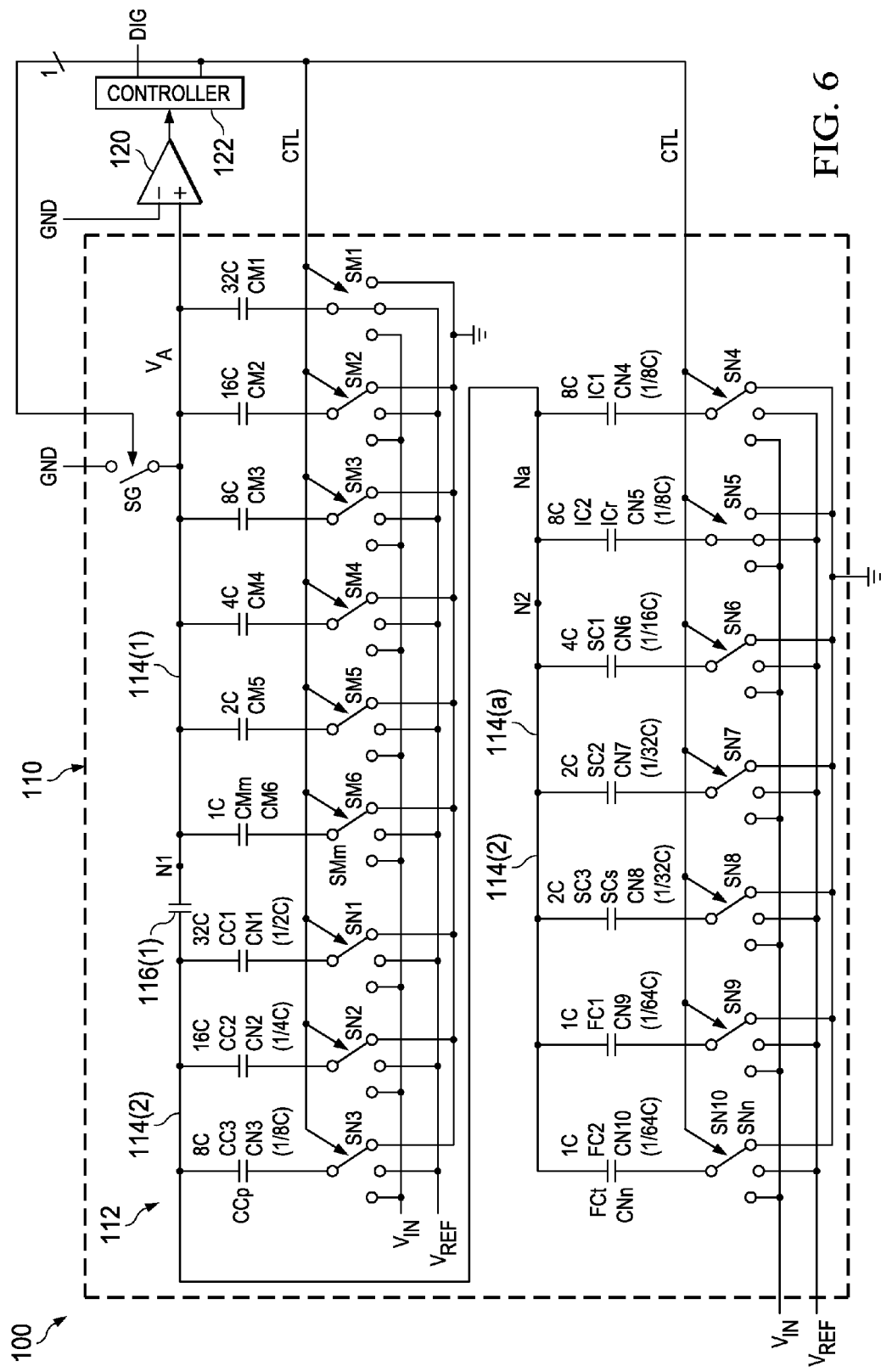
FIG. 6 is a circuit diagram illustrating an example of SAR ADC 100 following 426 in FIGS. 4A-4B in accordance with the present invention.

FIG. 6 shows a circuit diagram that illustrates an example of SAR ADC 100 following 426 in accordance with the present invention. As shown in FIG. 6, the second plate of the selected main conversion capacitor CM1 is connected to the reference voltage VREF, and the second plates of the remaining main conversion capacitors CM2-CM6 are connected to ground.

In addition, the second plates of the sub-conversion capacitors CC1-CC3 (CC1-CCp) are connected to ground, the integer calibration capacitor IC1 remains connected to ground, and the integer calibration capacitor IC2 remains connected to the reference voltage VREF. Further, the second plates of the shared capacitors SC1-SC3 (SC1-SCs) are connected to ground, and the fractional capacitors FC1-FC2 (FC1-FCf) remain connected to ground.

Connecting the main conversion capacitors CM1-CMm and the sub-DAC capacitors CN1-CNn as illustrated in FIG. 6 example redistributes the charge, and places the DAC voltage VA on main node N1 (which is input to comparator 120). As is well known in the art, the DAC voltage VA is proportional to the sum of the specified capacitances of the capacitors CM1-CMm and CN1-CNn that are connected to the reference voltage VREF, multiplied times the reference voltage VREF. In the present example, the sum of the specified capacitances of the capacitors CM1 and CN5 that are connected to the reference voltage VREF is equal to 32 1/8C.

Thus, method 400 connects the reference voltage VREF to the second plates of a second number of capacitors of the capacitors CM1-CMm and CN1-CNn, and ground to the remaining number of capacitors of the capacitors CM1-CMm and CN1-CNn to generate a first DAC voltage. The second number of capacitors includes the main conversion capacitor that is being calibrated, but excludes any previous main conversion capacitors that have been calibrated. The sum of the specified capacitances of the second number of capacitors adds up to a second value that is equal to the first value.

After the connections have been made in 426, method 400 moves to 428 to compare the first DAC voltage VA to a control voltage to determine a sign of the DAC voltage VA. In the present example, the control voltage is ground. The DAC voltage VA on main node N1 is equal to zero when the actual capacitances of the capacitors CM1-CMm are equal to the specified capacitances. However, due to manufacturing tolerances and other effects, the actual capacitances of the capacitors are typically not equal to the specified capacitances.

When compared to ground, variations from the specified capacitor values cause the DAC voltage VA to be positive when the actual capacitance is greater than the specified capacitance, and negative when the actual capacitance is less than the specified capacitance. Once the sign of the DAC voltage VA has been determined in 428, method 400 connects different shared and fractional calibration capacitors SC and FC to the reference voltage VREF to bring the DAC voltage VA as close to zero as possible.

When the sign is negative, which indicates that more capacitance can be added, method 400 moves from 428 to 434. When the sign is positive, which indicates that too much capacitance was added, method 400 moves from 428 to 432 to connect integer calibration capacitor IC2 to ground, and then on to 434. In 434, method 400 connects the second plate of the first shared capacitor SC1 to the reference voltage VREF. The connections to the remaining capacitors are left unchanged.

Figure 7:
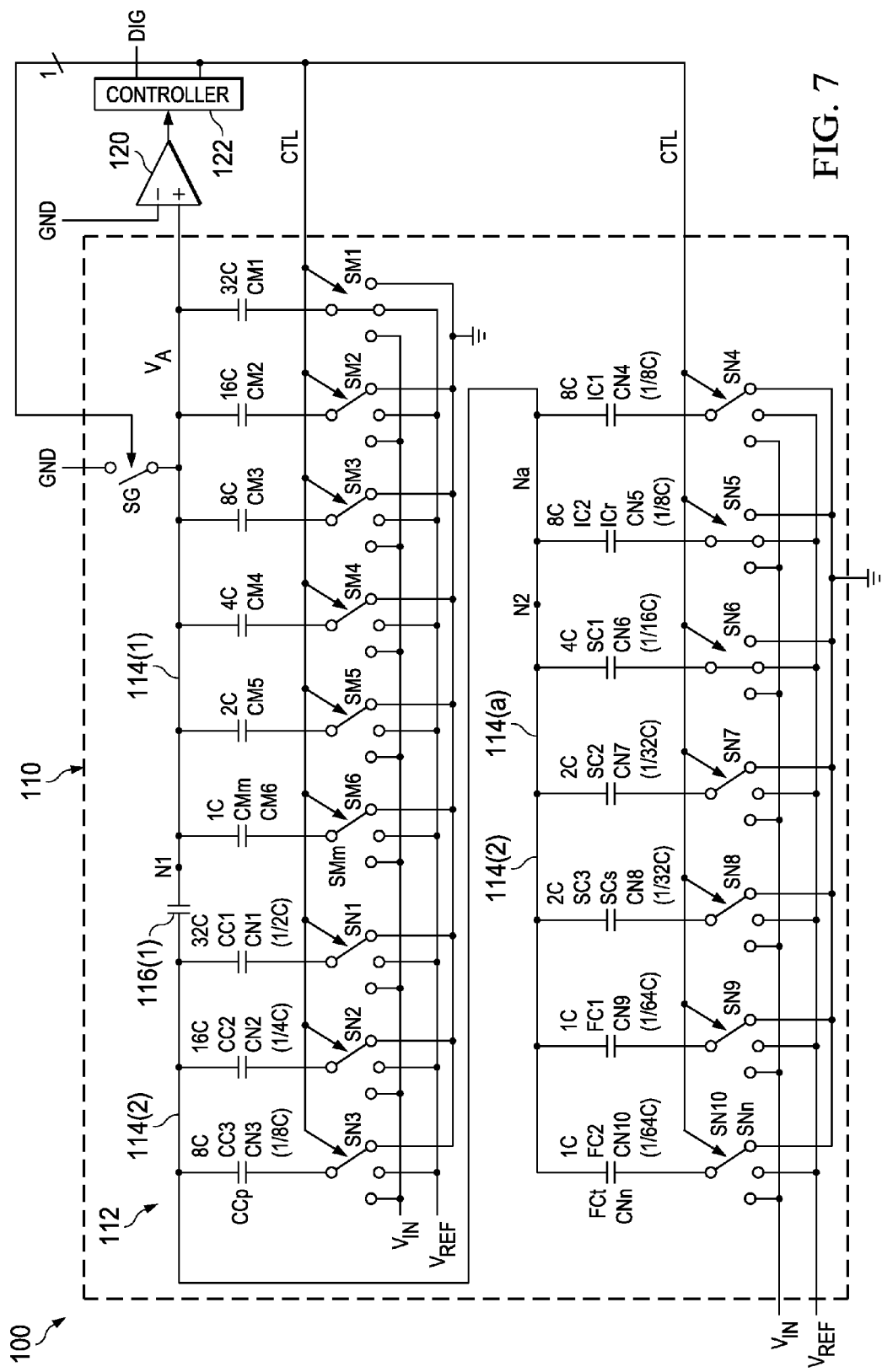
FIG. 7 is a circuit diagram illustrating an example of SAR ADC 100 following 434 in FIGS. 4A-4B in accordance with the present invention.

FIG. 7 shows a circuit diagram that illustrates an example of SAR ADC 100 following 434 in accordance with the present invention. As shown in FIG. 7, the second plate of the first shared capacitor SC1 is connected to the reference voltage VREF, while the connections to the remaining capacitors are unchanged. Connecting and reconnecting the capacitors generates a DAC voltage VA on the main node N1.

As shown in FIGS. 4A-4B, method 400 next moves from 434 to 436 to determine the sign of the DAC voltage VA from the comparison. Connecting the first shared capacitor SC1 to the reference voltage VREF as illustrated in FIG. 7 adds an amount of capacitance that changes the sum of the capacitances and, in turn, the DAC voltage VA.

When the sign is positive in 436, which indicates that capacitor SC1 added too much capacitance, method 400 moves from 436 to 438 to reconnect the first shared capacitor SC1 to ground, and next to 440 to determine if the shared capacitor SC1 is the last shared capacitor SCs−1 to be evaluated.

When a negative sign is detected in 436, which indicates that more capacitance can be added, method 400 leaves the first shared capacitor SC1 connected to the reference voltage VREF, and moves to 440 to determine if the shared capacitor SC1 is the last shared capacitor SCs−1 to be evaluated.

When the shared capacitor SC1 is not the last shared capacitor SCs−1 to be evaluated, method 400 moves to 442 to increment the variable Y, and then back to 434 to connect the second plate of the next shared capacitor SC2 to the reference voltage VREF. Method 400 continues to loop through 434 to 440 adding and removing capacitance as indicated by the sign in 436 until the shared capacitor SC is the last shared capacitor SCs−1 to be evaluated.

When the last shared capacitor SCs−1 (SC2) to be evaluated is detected, method 400 moves from 440 to 444 to redefine the variable Y to be equal to one, and then on to 446 to connect the second plate of the first fractional calibration capacitor FC1 to the reference voltage VREF. The connections to the remaining capacitors are left unchanged.

Figure 8:
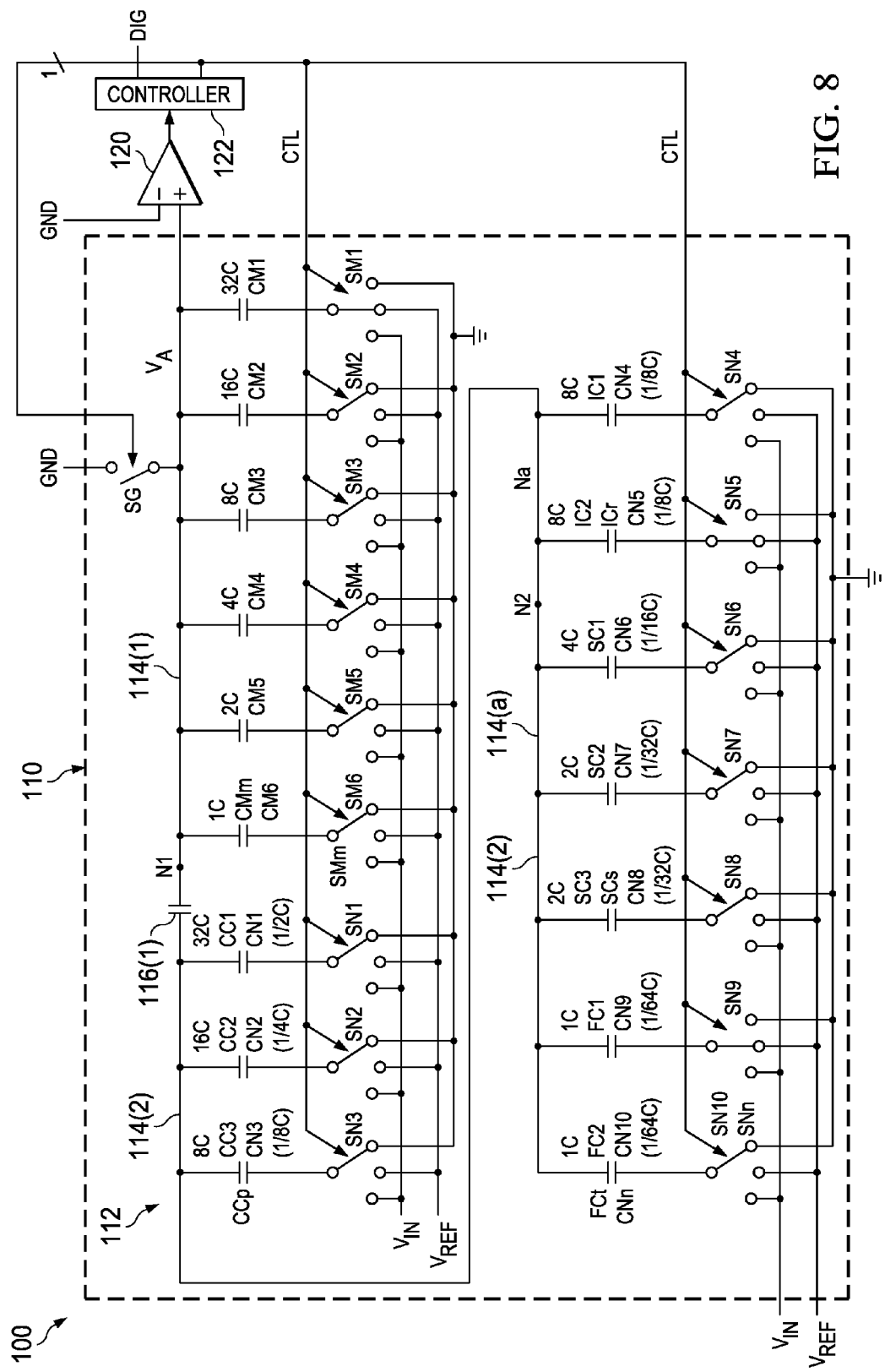
FIG. 8 is a circuit diagram illustrating an example of SAR ADC 100 following 446 in FIGS. 4A-4B in accordance with the present invention.

FIG. 8 shows a circuit diagram that illustrates an example of SAR ADC 100 following 446 in accordance with the present invention. As shown in FIG. 8, the second plate of the first fractional calibration capacitor FC1 is connected to the reference voltage VREF, while the connections to the remaining capacitors are unchanged. Connecting and reconnecting the capacitors generates a DAC voltage VA on the main node N1.

As shown in the FIGS. 4A-4B example, method 400 moves from 446 to 448 to determine the sign of the DAC voltage VA from the comparison. Connecting the first fractional calibration capacitor FC1 to the reference voltage VREF as illustrated in FIG. 8 adds an amount of capacitance that changes the sum of the capacitances and, in turn, the DAC voltage VA.

When the sign is positive in 448, which indicates that capacitor FC1 added too much capacitance, method 400 moves from 448 to 450 to reconnect the first fractional calibration capacitor FC1 to ground, and next to 452 to determine if the fractional calibration capacitor FC1 is the last fractional calibration capacitor FCf−1 to be evaluated.

When a negative sign is detected in 448, which indicates that more capacitance can be added, method 400 leaves the first fractional calibration capacitor FC1 connected to the reference voltage VREF, and moves to 452 to determine if the fractional calibration capacitor FC1 is the last fractional calibration capacitor FCf−1 to be evaluated.

When the fractional calibration capacitor FC1 is not the last fractional calibration capacitor FCf−1 to be evaluated, method 400 continues to loop through 446 to 452 adding and removing capacitance as indicated by the sign in 448 until the fractional calibration capacitor FC is the last fractional calibration capacitor FCf−1 to be evaluated. When the last fractional calibration capacitor FCf−1 (e.g., FC1) to be evaluated is detected, method 400 moves from 452 to 456 to finish, having determined the calibration conditions for the main conversion capacitors CM1-CMm.

In the normal mode of operation, SAR ADC 100 samples the input voltage VIN, and generates the digital word DIG that represents the sampled input voltage. The digital word DIG is generated by sequentially determining a logic value for each bit in the digital word DIG. Calibration is applied when determining the logic values that correspond with the main conversion capacitors CM.

Figure 9A:
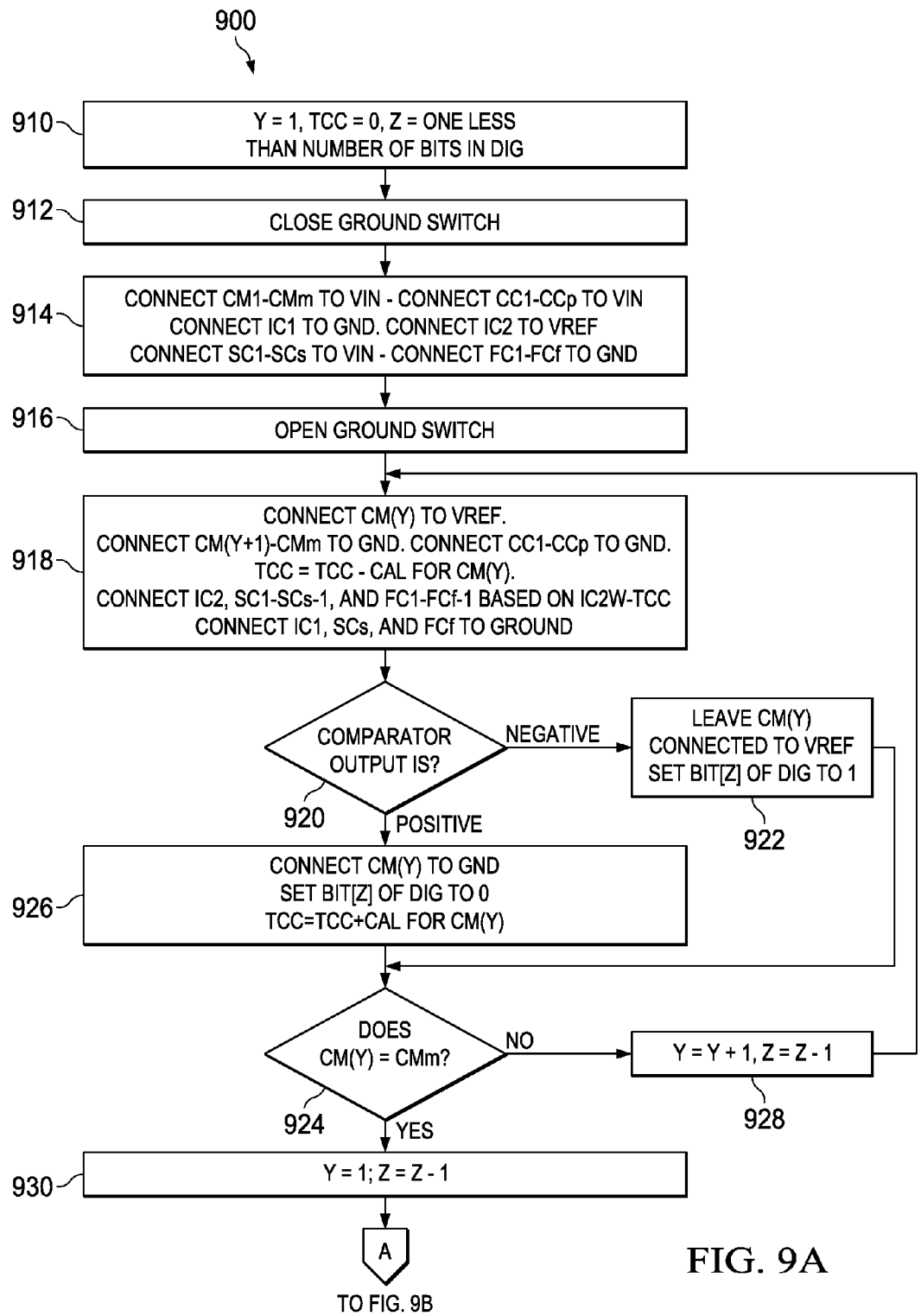
FIGS. 9A-9C are a flow chart illustrating an example of a method 900 of operating SAR ADC 100 in normal mode in accordance with the present invention.
Figure 9B:
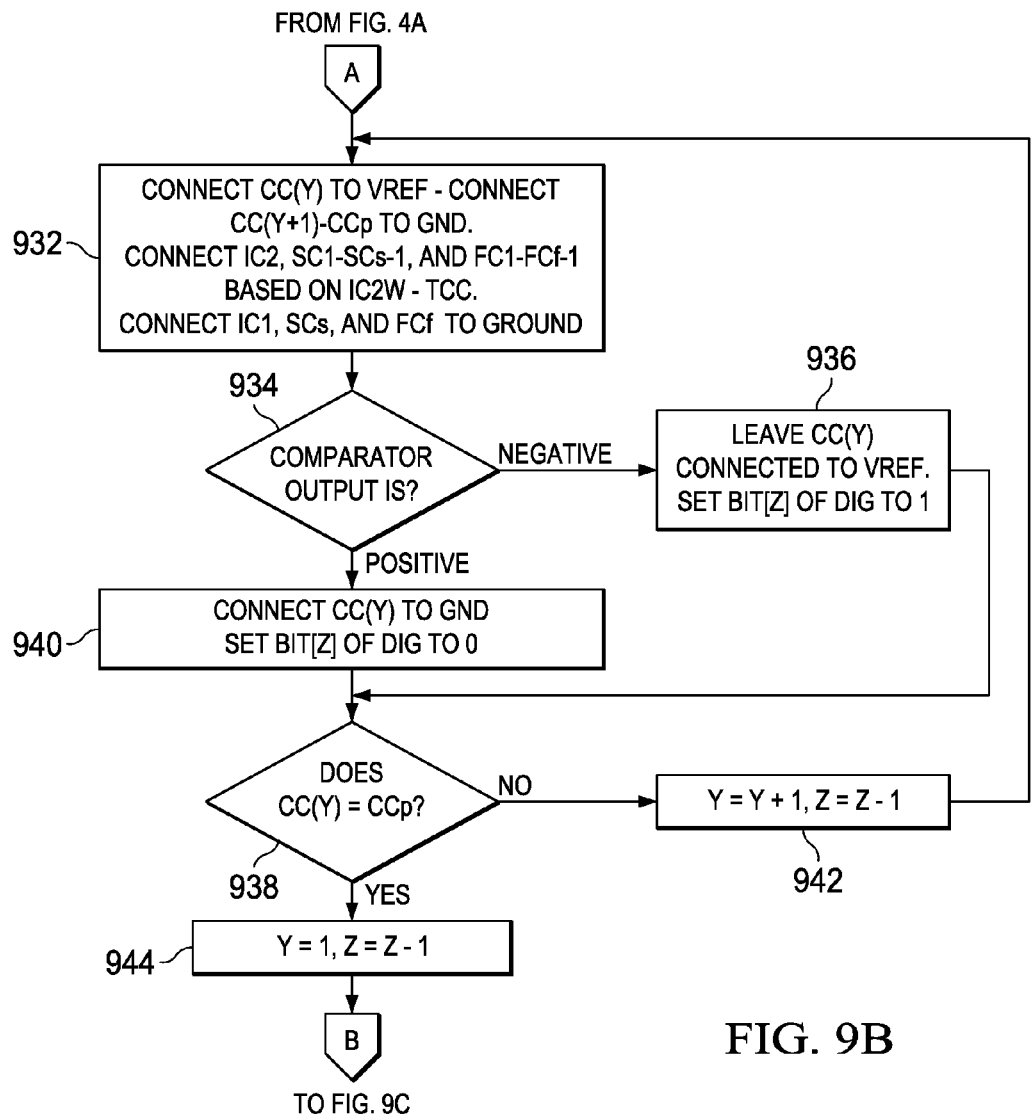
Figure 9C:
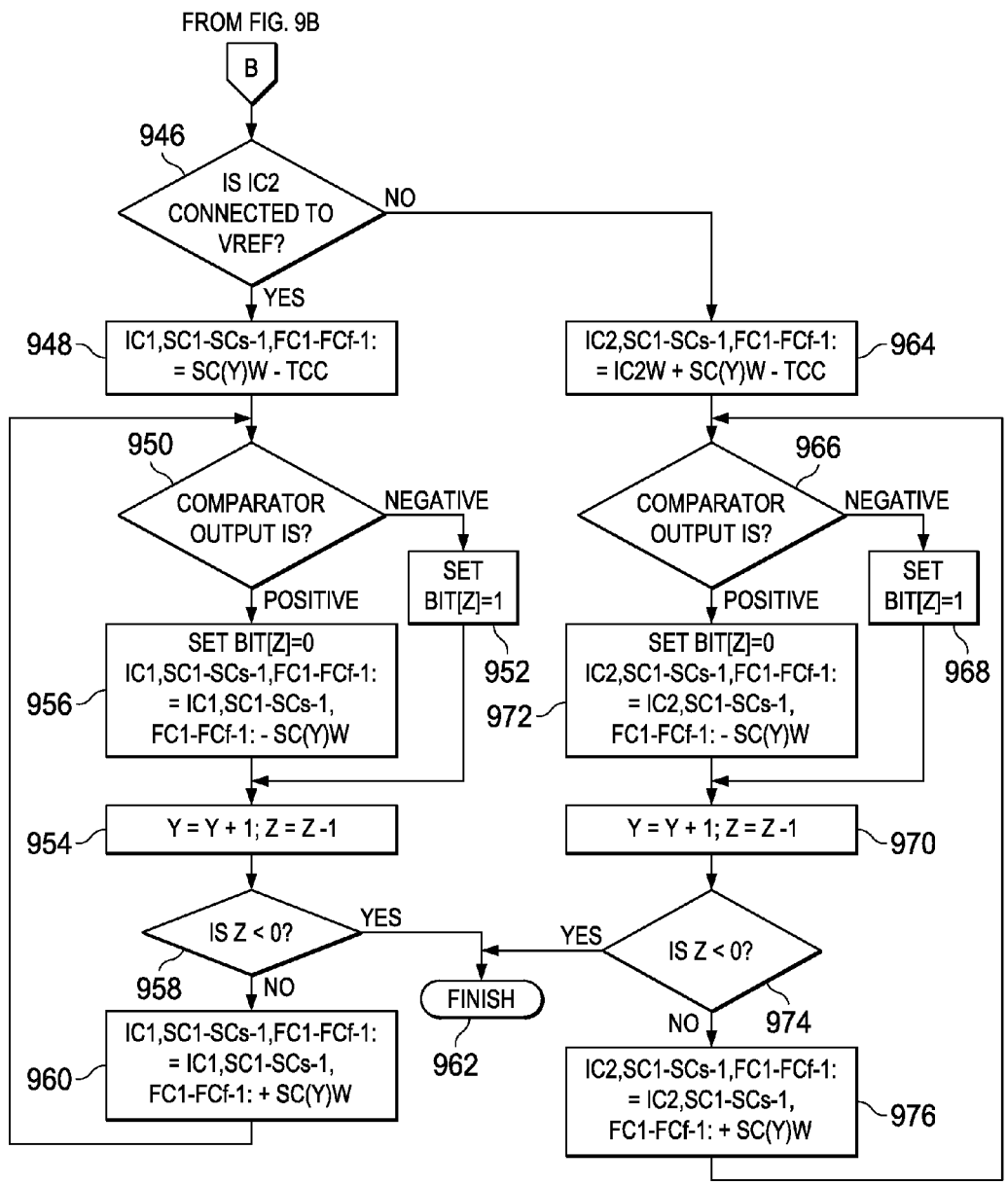

FIGS. 9A-9C show a flow chart that illustrates an example of a method 900 of operating SAR ADC 100 in normal mode in accordance with the present invention. Method 900 begins at 910 by defining a variable Y, a variable TCC, and a variable Z. Variable Y, which is set to 1, counts the number of capacitors that have been evaluated within a number of loops.

Variable TCC, which is set to 0, keeps a running total of the calibration conditions. Variable Z, which is set to be one less than the number of bits in the digital word DIG, counts down the number of bits in the digital word DIG that have been evaluated. In the FIG. 1 example, SAR ADC 100 generates an 11-bit word and, therefore, Z=10.

Following this, method 900 moves to 912 to close the ground switch SG, and then to 914 to connect the input voltage VIN to the second plates of all the capacitors that correspond to a bit in the digital word DIG, i.e., CM1-CMm, CC1-CCp, and SC1-SCs−1, along with the dummy capacitor SCs. The calibration capacitors IC1 and FC1-FCf are connected to ground, while the calibration capacitor IC2 is connected to the reference voltage VREF.

After this, method 900 moves to 916 to open the ground switch SW, and then to 918 to connect the second plate of the first main conversion capacitor CM1 to the reference voltage VREF, and connect the second plates of the remaining main conversion capacitors CM2-CMm to ground.

In addition, method 900 connects the second plates of the sub-conversion capacitors CC1-CC3 (CCp) to ground, and redefines the variable TCC to be as shown in equation EQ. 1:

$$TCC=TCC-(\text{Calibration (Cal.) for } CM(Y)). \qquad \text{EQ. 1}$$

(Cal. for CM(Y)) is defined by the value of Y such that:
(Cal. for CM1)=½(Cal. for CM1')
(Cal. for CM2)=½{(Cal. for CM2')−(Cal. for CM1)}
(Cal. for CM3)=½{(Cal. for CM3')−(Cal. for CM1)−(Cal. for CM2)} with (Cal. for CM4)−(Cal. CMm) following the same pattern.

(Cal. for CM(Y)'), in turn, is defined by equation EQ. 2:

$$\begin{aligned}(\text{Cal. for } CM(Y)') = &(IC2L)(IC2W)+(SC1L)\\&(SC1W)+ \ldots + (SCs\text{-}1L)(SCs\text{-}1W)+(FC1L)\\&(FC1W)+ \ldots +(FCf\text{-}1L)(FCf\text{-}1W)\text{-}IC2W.\end{aligned} \qquad \text{EQ. 2}$$

where IC2L is a logic state that defines how capacitor IC2 was connected during the calibration of CM(Y) (ground=logic 0, the reference voltage VREF=1), SC1L-SCs−1L are logic states that define how capacitors SC1-SCs−1 were connected during the calibration of CM(Y), and FC1L-FCf−1L are logic states that define how capacitors FC1-FCf−1 were connected during the calibration of CM(Y).

In addition, IC2W, SC1W-SCs−1W, and FC1W-FCf−1W are binary weight values of the capacitors IC2, SC1-SCs−1, and FC1-FCf−1, respectively, where IC2 has a most significant bit position, SCs−1 has a least significant bit position, and FC1-FCf−1 have fractional bit positions. For example, when there are five shared capacitors SC1-SC5 and four fractional calibration capacitors, the binary weight values are shown in TABLE 1. (SC5 and FC4 are not included as these values are always zero.)

TABLE 1

| Capacitor | IC2 | SC1 | SC2 | SC3 | SC4 | FC1 | FC2 | FC3 |
|---|---|---|---|---|---|---|---|---|
| Weight | $2^4$ | $2^3$ | $2^2$ | $2^1$ | $2^0$ | $2^{-1}$ | $2^{-2}$ | $2^{-3}$ |

In the FIG. 8 example, where there are three shared capacitors and two fractional calibration capacitors, (Cal. for CM(Y)') is defined by equation EQ. 3:

$$\begin{aligned}(\text{Cal. for } CM(Y)') = &(IC2L)(IC2W)+(SC1L)(SC1W)+\\&(SC2L)(SC2W)+(FC1L)(FC1W)\text{-}IC2W.\end{aligned} \qquad \text{EQ. 3}$$

Further in the FIG. 8 example, for the first main conversion capacitor CM1, the logic state IC2L=1 (connected to VREF), the logic state SC1L=0 (connected to ground), the logic state SC2L=0, and the logic state FC1L=1. In addition, the weights of the capacitors IC2, SC1, SC2, and FC1 in the FIG. 8 example are shown in TABLE 2.

TABLE 2

| Capacitor | IC2 | SC1 | SC2 | FC1 |
|---|---|---|---|---|
| Logic State | 1 | 0 | 0 | 1 |
| Weight | $2^2$ | $2^1$ | $2^0$ | $2^{-1}$ |

Substituting the values from TABLE 2 into EQ. 3 yields a decimal value of:

(Cal. for $CM(1)'$)=(1)(4)+(0)(2)+(0)(1)+(1)(½)−4=½.

Since (Cal. for CM1)=½(Cal. for CM1'), (Cal. for CM1)=¼.
After TCC=TCC−(Cal. for CM(Y)) has been determined in 918, the connections of the capacitors IC2, SC1, SC2, and FC1 are defined according to equation EQ. 4:

$$IC2,SC1,SC2,FC1:=IC2W\text{-}TCC \qquad \text{EQ. 4}$$

Substituting the values into EQ. 4 yields a decimal value of:

IC2,SC1,SC2,FC1:=4−¼=3¾.

Since the FIG. 8 example has a resolution of ½, the 3¾ value is rounded up to 4. Converting 4 back to binary yields the calibration connections for IC2, SC1, SC2, FC1 as shown in TABLE 3.

TABLE 3

| Capacitor | IC2 | SC1 | SC2 | FC1 |
|---|---|---|---|---|
| GND = 0<br>VREF = 1 | 1 | 0 | 0 | 0 |

Thus, in the FIG. 8 example, IC2 is connected to the reference voltage VREF, SC1 is connected to ground, SC2 is connected to ground, and FC1 is connected to ground. In addition, IC1 is (always) connected to ground (but may later be connected to the reference voltage VREF), SC3 is (always) connected to ground, and FC2 is (always) connected to ground.

After the capacitors IC1-FCf have been connected in 918, method 900 moves to 920. Connecting and reconnecting the voltages in 914 and 918 generates a DAC voltage VA equal to (½VREF−VIN) on the main node N1 and the input of comparator 120. Method 900 determines the sign (positive or negative) of the comparison in 920.

To determine the sign, SAR ADC 100 compares the DAC voltage VA to a control voltage. In the present example, the control voltage is ground. When the comparator output is negative or low (when the DAC voltage VA is less than zero, i.e., ½VREF−VIN<0), method 900 moves to 922 to leave the reference voltage VREF connected to the main conversion capacitor CM(Y), set the MSB of the digital word DIG (e.g., bit10 in the FIG. 1 example) to a logic 1, and then to 924 to determine if the capacitor CM(Y) is the last main conversion capacitor CMm.

When the comparator output is positive or high in 920 (when the DAC voltage is greater than zero, i.e., ½ VREF−VIN>0), method 900 moves to 926 to connect the main conversion capacitor CM(Y) to ground, and set the MSB of the digital word DIG (e.g., bit10 in the FIG. 1 example) to a logic 0. In addition, TCC is redefined as TCC=TCC+(Cal. for CM(Y)). The (Cal. for CM(Y)) is added back to TCC because capacitor CM(Y) was reconnected to ground. Method 900 then moves to 924 to determine if the capacitor CM is the last main conversion capacitor CMm.

Thus, to determine the logic value of the most significant bit (MSB) (e.g., bit[10] in the FIG. 1 example) within the digital word DIG, SAR ADC 100 closes the ground switch SG, and then connects the input voltage VIN to a number of capacitors that include the main conversion capacitors CM1-CMm, the sub-conversion capacitors CC1-CCp, and the shared capacitors SC1-SCs−1.

Following this, SAR ADC 100 opens the ground switch SG, and then connects the reference voltage VREF to a number of capacitors that include main conversion capacitor CM1, and a selected number of the shared capacitors SC1-SCs−1. Connecting and reconnecting the voltages generates a MSB DAC voltage which is compared to ground. The result of the comparison determines whether the MSB is a logic one or a logic zero.

When the capacitor CM(Y) is not the last main conversion capacitor CMm, method 900 moves from 924 to 928 to increment the variable Y and decrement the variable Z. Following this, method 900 returns to 918 to loop through 924 until each of the main conversion capacitors CM1-CMm has been evaluated.

On each loop, TCC is redefined. There are calibrations conditions for each of the main conversion capacitors CM(Y). When more than one main conversion capacitor CM(Y) is connected to the reference voltage VREF, more than one calibration condition is present. When the calibration conditions for more than one main conversion capacitor CM(Y) are present, TCC sums together the decimal values for each main conversion capacitor CM(Y) that is connected to the reference voltage VREF.

When the capacitor CM(Y) is the last main conversion capacitor CMm in 924, method 900 moves to 930 to reset the variable Y to Y=1 and decrement the variable Z. After this, method 900 moves to 932 to connect the second plate of the first sub-conversion capacitor CC1 to the reference voltage VREF, and connect the second plates of the remaining sub-conversion capacitors CC to ground. In addition, method 900 connects the second plates of the capacitors IC2, SC1-SCs−1, and FC1-FCf−1 as defined by IC2W−TCC. Method 900 also leaves IC1, SCs, and FCf connected to ground.

Further, the second plates of the main conversion capacitors CM are left connected as previously determined in 918-928. In other words, when a capacitor is connected to the reference voltage VREF and the resulting comparison is negative, the capacitor remains connected to the reference voltage VREF until each bit in the digital word DIG has been determined. Connecting and reconnecting the voltages places a DAC voltage VA on the input of comparator 120.

Method 900 next moves to 934 to determine the sign (positive or negative) of the comparison. When the output of comparator 120 is negative, method 900 moves to 936 to leave the reference voltage VREF connected to the first sub-conversion capacitor CC1, set the corresponding bit of the digital word DIG (e.g., bit[4] in the FIG. 1 example) to a logic 1, and then to 938 to determine if the capacitor CC(Y) is the last sub-conversion capacitor CCp.

When the comparator output is positive, method 900 moves from 934 to 940 to reconnect the first sub-conversion capacitor CC1 to ground, and set the corresponding bit of the digital word DIG (e.g., bit[4] in the FIG. 1 example) to a logic 0. Method 900 then moves to 938 to determine if the capacitor CC(Y) is the last sub-conversion capacitor CCp.

When the capacitor CC(Y) is not the last sub-conversion capacitor CCp, method 900 moves from 938 to 942 to increment the variable Y and decrement the variable Z. Following this, method 900 returns to 932 to loop through 938 until each of the sub-conversion capacitors CC1-CCp has been evaluated.

When the capacitor CC(Y) is the last sub-conversion capacitor CCp in 938, method 900 moves to 944 to reset the variable Y to Y=1 and decrement the variable Z. After this, method 900 moves to 946 to determine the values of the remaining bits in the digital word DIG. In the FIG. 1 example, bit[2] was defined by capacitor CC3. As a result, the remaining bits in the digital word DIG in the FIG. 1 example include bit[1] and bit[0].

To determine the values of the remaining bits in the digital word DIG, method 900 next determines if capacitor IC2 is connected to the reference voltage VREF. When capacitor IC2 is connected to the reference voltage VREF, method 900 moves to 948 to determine the connections for the capacitors IC1,SC1-SCs−1,FC1-FCf−1. The connections to the capacitors IC1,SC1-SCs−1,FC1-FCf−1 are determined by equation EQ. 5.

$$IC1,SC1\text{-}SCs\text{−}1,FC1\text{-}FCf\text{−}1 = SC(Y)W\text{−}TCC \qquad \text{EQ. 5}$$

Connecting and reconnecting the voltages generates the DAC voltage VA, which is compared to the control voltage, e.g., ground. Method 900 next moves to 950 to determine the sign (positive or negative) of the comparison. When the comparator output is negative, method 900 moves to 952 to set the corresponding bit[Z] of the digital word DIG to a logic 1, and then to 954 to increment the variable Y and decrement the variable Z.

When the comparator output is positive, method 900 moves from 950 to 956 to set the corresponding bit[Z] of the digital word DIG to a logic 0. Method 900 also redefines IC1,SC1-SCs−1,FC1-FCf−1: (which changes the connections to the capacitors IC1, SC1-SCs−1, and FC1-FCf−1) as shown in equation EQ. 6.

$$IC1,SC1\text{-}SCs\text{−}1,FC1\text{-}FCf\text{−}1 := IC1,SC1\text{-}SCs\text{−}1,FC1\text{-}FCf\text{−}1 :\text{−}SC(Y)W \qquad \text{EQ. 6}$$

The term SC(Y)W is removed because the comparison result was positive. Following this, method 900 moves to 954 to increment the variable Y and decrement the variable Z. From 954, method 900 then moves to 958 to determine if the last bit or LSB of the digital word DIG has been determined. When the LSB of the digital word DIG has not been determined, method 900 moves to 960 to redefine IC1,SC1-SCs−1,FC1-FCf−1: as shown in equation EQ. 7.

$$IC1,SC1\text{-}SCs\text{−}1,FC1\text{-}FCf\text{−}1 := IC1,SC1\text{-}SCs\text{−}1,FC1\text{-}FCf\text{−}1 :\text{+}SC(Y)W \qquad \text{EQ. 7}$$

Following this, method 900 returns to 950 to loop through 958 until the LSB in the digital word DIG has been evaluated. When the LSB in the digital word DIG has been evaluated in 958, method 900 moves to 962 to finish.

Referring back to 946, when capacitor IC2 is not connected to the reference voltage VREF, method 900 moves to 964 to determine the connections for the capacitors IC2, SC1-SCs−1, FC1-FCf−1. The connections to the capacitors IC2, SC1-SCs−1, FC1-FCf−1 are determined by equation EQ. 8.

$$IC2,SC1\text{-}SCs\text{−}1,FC1\text{-}FCf\text{−}1 = IC2W + SC(Y)W\text{−}TCC \qquad \text{EQ. 8}$$

Connecting and reconnecting the voltages generates the DAC voltage VA, which is compared to the control voltage, e.g., ground. Method 900 next moves to 966 to determine the sign (positive or negative) of the comparison. When the comparator output is negative, method 900 moves to 968 to set the corresponding bit[Z] of the digital word DIG to a logic 1, and then to 970 to increment the variable Y and decrement the variable Z.

When the comparator output is positive, method 900 moves from 966 to 972 to set the corresponding bit[Z] of the digital word DIG to a logic 0. Method 900 also redefines IC2,SC1-SCs−1,FC1-FCf−1: (which changes the connections to the capacitors IC2, SC1-SCs−1, and FC1-FCf−1) as shown in equation EQ. 9.

$$IC2,SC1\text{-}SCs\text{−}1,FC1\text{-}FCf\text{−}1 := IC2,SC1\text{-}SCs\text{−}1,FC1\text{-}FCf\text{−}1:\text{−}SC(Y)W \qquad \text{EQ. 9}$$

The term SC(Y)W is removed because the comparison result was positive. Following this, method 900 moves to 970 to increment the variable Y and decrement the variable Z. From 970, method 900 then moves to 974 to determine if the LSB of the digital word DIG has been determined. When the LSB of the digital word DIG has not been determined, method 900 moves to 976 to redefine IC2,SC1-SCs−1,FC1-FCf−1: as shown in equation EQ. 10.

$$IC2,SC1\text{-}SCs\text{−}1,FC1\text{-}FCf\text{−}1 := IC2,SC1\text{-}SCs\text{−}1,FC1\text{-}FCf\text{−}1:+SC(Y)W \qquad \text{EQ. 10}$$

Following this, method 900 returns to 966 to loop through 974 until the LSB in the digital word DIG has been evaluated. When the LSB in the digital word DIG has been evaluated in 974, method 900 moves to 962 to finish. Thus, to determine the logic value of the LSB, SAR ADC 100 connects the reference voltage VREF to a number of capacitors that include a selected number of shared capacitors SC1-SCs−1. Connecting and reconnecting the voltages generates a LSB DAC voltage which is compared to ground. The result of the comparison determines whether the LSB is a logic one or a logic zero.

Figure 10:
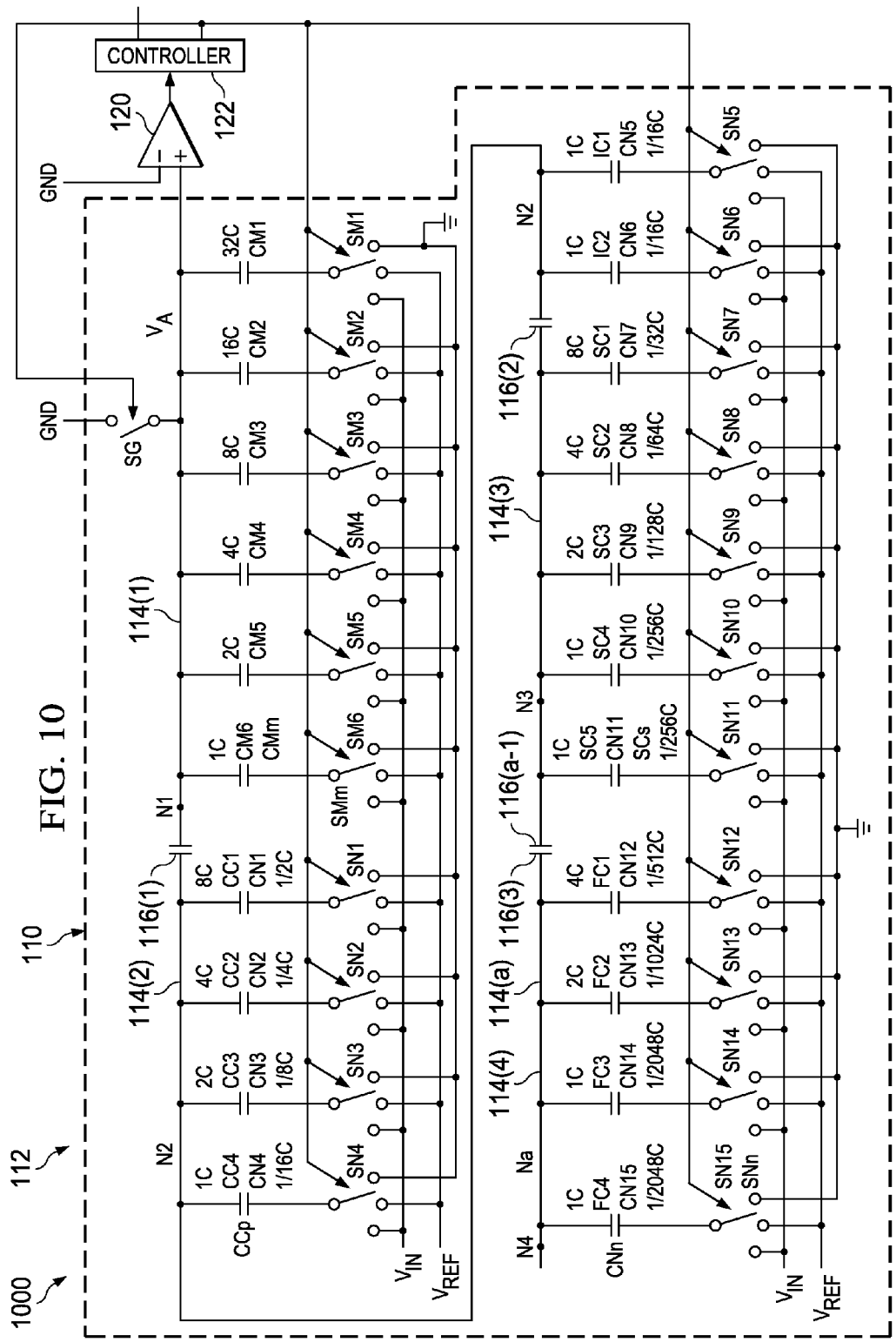
FIG. 10 is a circuit diagram illustrating an example of a calibrated high-resolution successive approximation register (SAR) analog-to-digital converter (ADC) 1000 in accordance with an alternate embodiment of the present invention.

FIG. 10 shows a circuit diagram that illustrates an example of a calibrated high-resolution successive approximation register (SAR) analog-to-digital converter (ADC) 1000 in accordance with an alternate embodiment of the present invention. SAR ADC converter 1000 and SAR ADC converter 100 are similar and, as a result, utilize the same reference identifiers to identify the structures that are common to both converters.

As shown in FIG. 10, SAR ADC converter 1000 differs from SAR ADC converter 100 in that SAR ADC converter 1000 has more segments and capacitors than SAR ADC converter 100. In the FIG. 10 example, SAR ADC 1000 has four segments (114(1), 114(2), 114(3), and 114(4)), three attenuation capacitors (116(1), 116(2), and 116(3)), and 21 capacitors (CM1-CM6 and CN1-CN15), and realizes a 14-bit SAR ADC with an 11-bit calibration. In contrast, SAR ADC 100 has two segments (114(1) and 114(2)), one attenuation capacitor (116(1)), and 16 capacitors (CM1-CM6 and CN1-CN10), and realizes an 11-bit SAR ADC with a 7-bit calibration. SAR ADC 1000 operates in the same manner as does SAR ADC 100.

Figure 11:
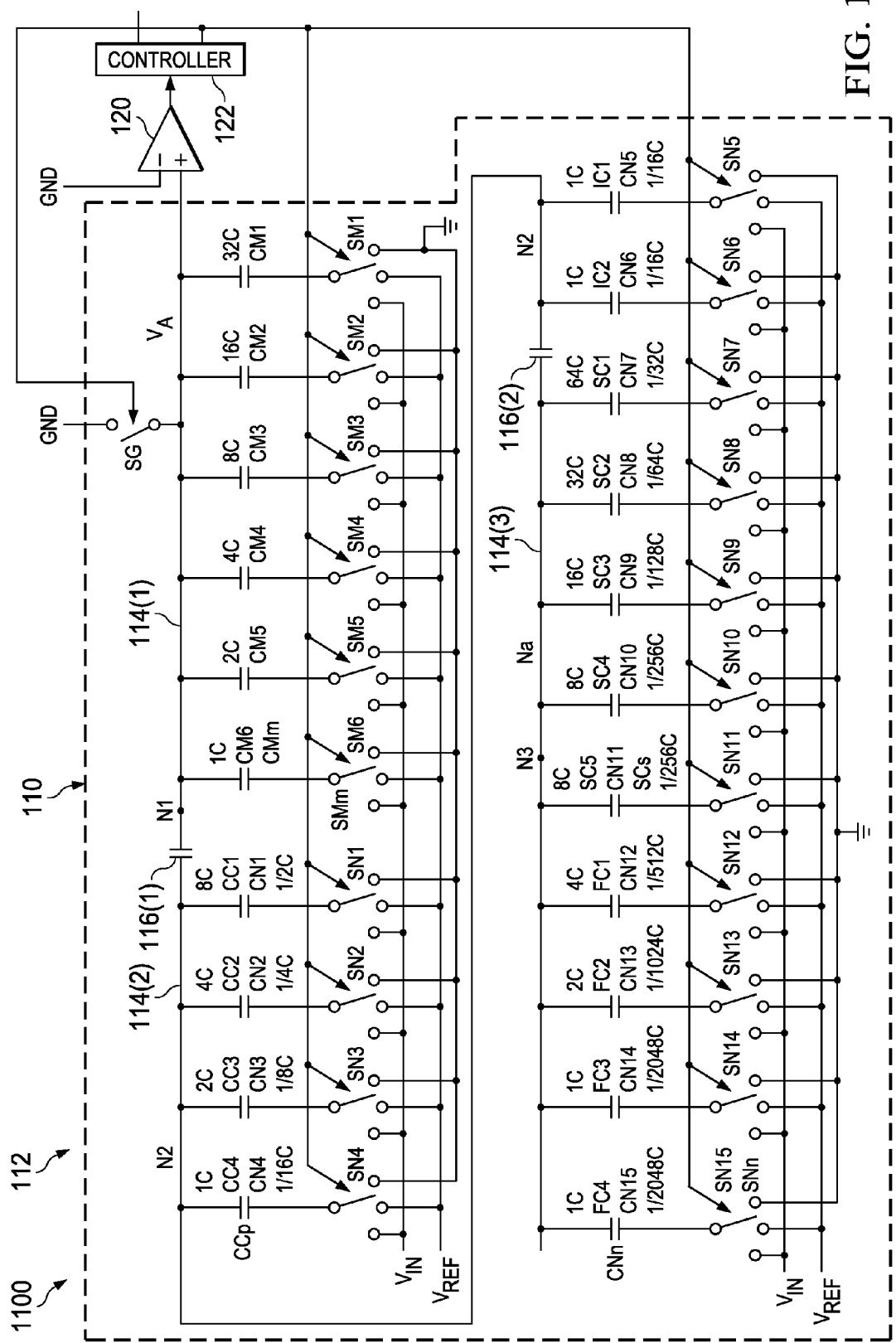
FIG. 11 is a circuit diagram illustrating an example of a calibrated successive approximation register (SAR) analog-to-digital converter (ADC) 1100 in accordance with an alternate embodiment of the present invention.

FIG. 11 shows a circuit diagram that illustrates an example of a calibrated successive approximation register (SAR) analog-to-digital converter (ADC) 1100 in accordance with an alternate embodiment of the present invention. SAR ADC converter 1100 and SAR ADC converter 100 are similar and, as a result, utilize the same reference identifiers to identify the structures that are common to both converters.

As shown in FIG. 11, SAR ADC converter 1100 differs from SAR ADC converter 100 in that SAR ADC converter 1100 has more segments and capacitors than SAR ADC converter 100. In the FIG. 11 example, SAR ADC 1100 has three segments (114(1), 114(2), and 114(3)), two attenuation capacitors (116(1) and 116(2)), and 21 capacitors (CM1-CM6 and CN1-CN15), and realizes a 14-bit SAR ADC with an 11-bit calibration. SAR ADC 1100 operates in the same manner as does SAR ADC 100.

Figure 12A:
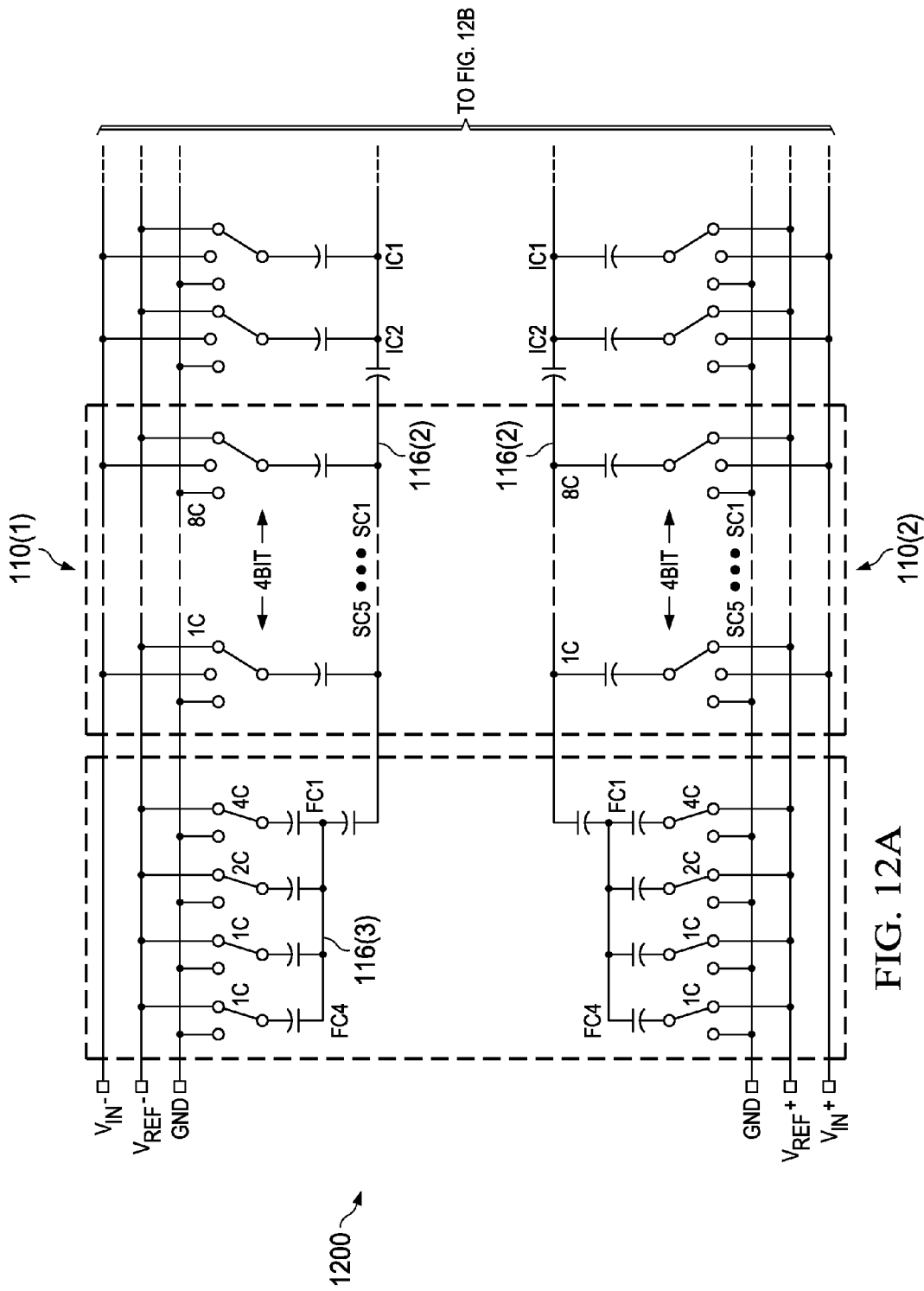
FIGS. 12A-12B are a circuit diagram illustrating an example of a differential successive approximation register (SAR) analog-to-digital converter (ADC) 1200 in accordance with an alternate embodiment of the present invention.
Figure 12B:
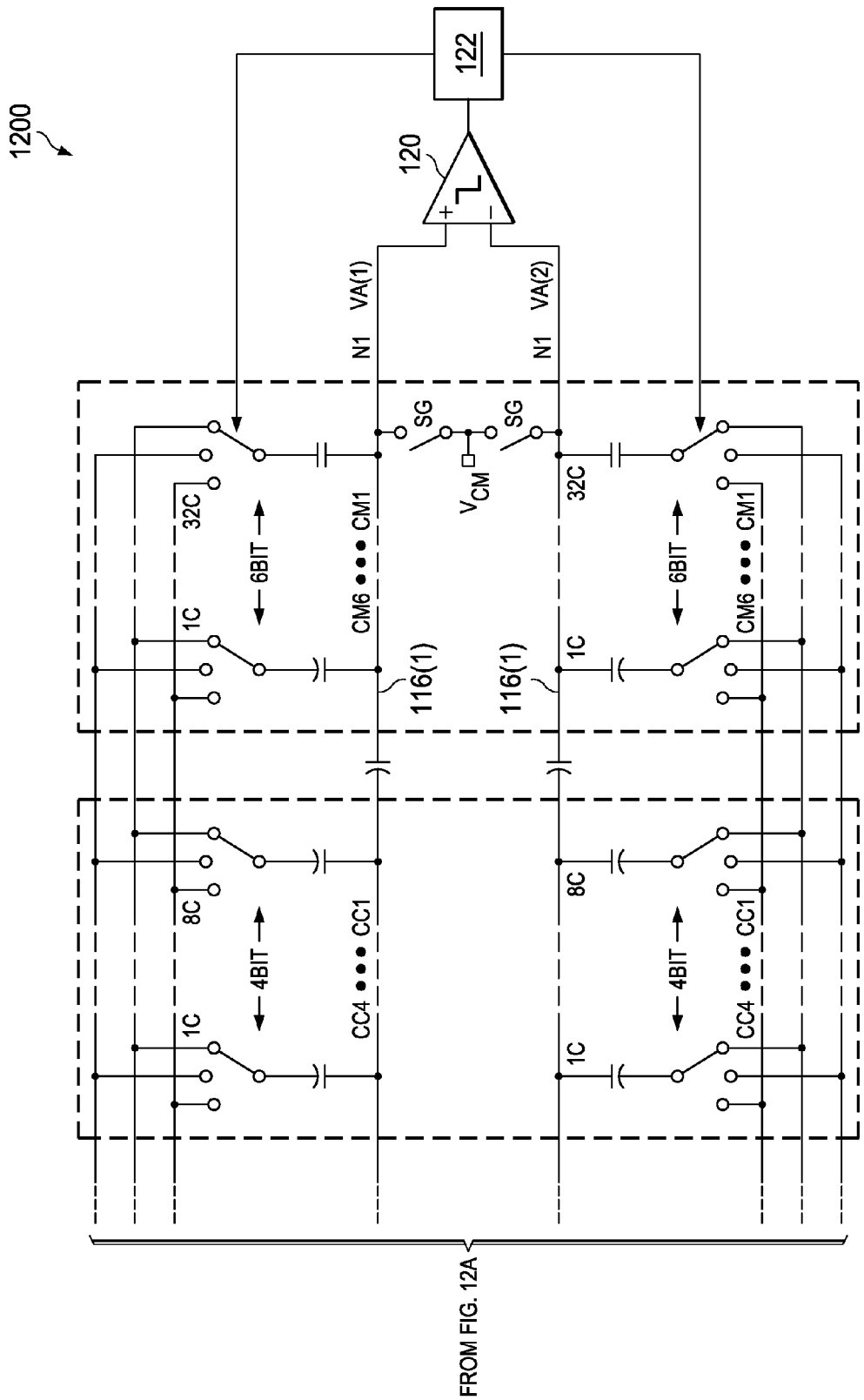

FIGS. 12A-12B shows a circuit diagram that illustrates an example of a differential successive approximation register (SAR) analog-to-digital converter (ADC) 1200 in accordance with an alternate embodiment of the present invention. SAR ADC converter 1200 and SAR ADC converter 1000 are similar and, as a result, utilize the same reference identifiers to identify the structures that are common to both converters.

As shown in FIGS. 12A-12B, differential SAR ADC converter 1200 differs from SAR ADC converter 1000 in that differential SAR ADC converter 1200 has two DACs 110(1) and 110(2) that are identical to DAC 110 of SAR ADC 1000, with the exception that DAC 110(1) receives the input and reference voltages VIN− and VREF−.

In addition, comparator 120 compares the DAC voltage VA(2) generated by DAC 110(2) to the DAC voltage VA(1) generated by DAC 110(1). SAR ADC 1200 operates the same as SAR ARC 1000 except that the DAC voltage VA(1) functions as the control voltage.

SAR ADC 100, SAR ADC 1000, SAR ADC 1100, and differential SAR ADC 1200 are examples of four arrangements of the present invention. Other arrangements with the same or different numbers of segments, and with the same or different numbers of capacitors, are evident in light of the present disclosure.

One of the advantages of the present invention is that the present invention reduces the silicon real estate that is required to implement a calibrated SAR ADC by utilizing the shared capacitors SC1-SCs−1, which function as calibration capacitors when in the calibration mode and as bit capacitors when in the normal mode. The reduction in size is particularly significant in a high-resolution SAR ADC, such as SAR ADC 1000.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A SAR ADC comprising:
   a DAC having a capacitor array, the capacitor array having a plurality of segments, and a number of attenuation capacitors that are connected to the plurality of segments such that an attenuation capacitor is connected to and between each adjacent pair of segments, the plurality of segments including:
   a main DAC segment having a number of binary-weighted main conversion capacitors, none of the number of binary-weighted main conversion capacitors having substantially identical weights;
   one or more sub-DAC segments having a number of binary-weighted sub-DAC capacitors, one sub-DAC segment having three binary-weighted sub-DAC capacitors that have substantially identical weights;
   a comparator connected to the DAC; and
   a controller connected to the DAC and the comparator;
   wherein the main DAC segment further has a number of main switches that are connected to the binary-weighted main conversion capacitors;
   wherein each of the main conversion capacitors has a first plate that is connected to a main node, and a second plate that is connected to a main switch, each main switch to be connected to receive an input voltage, a reference voltage, or ground, and a sequence of control words that each selects the input voltage, the reference voltage, or ground that is to be placed on the second plates of the main conversion capacitors.

2. The SAR ADC of claim 1 wherein the DAC further includes a ground switch that is connected between the main node and ground.

3. The SAR ADC of claim 2 wherein the sub-DAC segments further have a number of sub-switches that are connected to the binary-weighted sub-DAC capacitors.

4. The SAR ADC of claim 3 wherein each of the sub-DAC capacitors has a first plate that is connected to a sub-node, and a second plate that is connected to a sub-switch, each sub-switch to be connected to receive the input voltage, the reference voltage, or ground, and the sequence of control words that each selects the input voltage, the reference voltage, or ground that is to be placed on the second plates of the sub-conversion capacitors.

5. The SAR ADC of claim 4 wherein the controller is connected to the ground switch, the main switches, and the sub-switches.

6. The SAR ADC of claim 5 wherein the plurality of segments are arranged in series.

7. A SAR ADC comprising:
a DAC having a capacitor array, the capacitor array having a plurality of segments, and a number of attenuation capacitors that are connected to the plurality of segments such that an attenuation capacitor is connected to and between each adjacent pair of segments, the plurality of segments including:
a main DAC segment having a number of binary-weighted main conversion capacitors, none of the number of binary-weighted main conversion capacitors having substantially identical weights;
one or more sub-DAC segments having a number of binary-weighted sub-DAC capacitors, one sub-DAC segment having three binary-weighted sub-DAC capacitors that have substantially identical weights;
a comparator connected to the DAC; and
a controller connected to the DAC and the comparator;
further comprising a differential DAC that is connected to the comparator and the controller, the differential DAC having a differential capacitor array, the differential capacitor array having a plurality of differential segments, and a number of differential attenuation capacitors that are connected to the plurality of differential segments such that a differential attenuation capacitor is connected to and between each adjacent pair of differential segments, the plurality of differential segments including:
a differential main DAC segment having a number of binary-weighted differential main conversion capacitors, none of the number of binary-weighted differential main conversion capacitors having substantially identical weights;
one or more differential sub-DAC segments having a number of binary-weighted differential sub-DAC capacitors, one differential sub-DAC segment having three binary-weighted differential sub-DAC capacitors that have substantially identical weights.

8. A method of calibrating a SAR ADC comprising:
closing a ground switch;
connecting a reference voltage to a first selected number of capacitors of a plurality of capacitors, and ground to a first remaining number of capacitors of the plurality of capacitors, the first selected number of capacitors excluding a main conversion capacitor that is being calibrated and any previous main conversion capacitors that have been calibrated, each of the plurality of capacitors having a specified capacitance, a sum of the specified capacitances of the first selected number of capacitors adding up to a first value;
opening the ground switch after the reference voltage has been connected to the first selected number of capacitors, and ground to the first remaining number of capacitors;
connecting the reference voltage to a second selected number of capacitors of the plurality of capacitors, and ground to a second remaining number of capacitors of the plurality of capacitors to generate a first DAC voltage after the ground switch has been opened, the second selected number of capacitors including the main conversion capacitor that is being calibrated, and excluding any previous main conversion capacitors that have been calibrated, a sum of the specified capacitances of the second selected number of capacitors adding up to a second value that is equal to the first value.

9. The method of claim 8 and further comprising comparing the first DAC voltage to a control voltage to determine a first comparison sign.

10. The method of claim 9 and further comprising:
connecting an integer calibration capacitor to ground and a first shared capacitor to the reference voltage when the first comparison sign is positive to generate a second DAC voltage; and
comparing the second DAC voltage to the control voltage to determine a second comparison sign.

11. The method of claim 10 and further comprising:
connecting the first shared capacitor to the reference voltage when the first comparison sign is negative to generate a third DAC voltage; and
comparing the third DAC voltage to the control voltage.

12. A method of operating a SAR ADC comprising:
first determining a logic value for a most significant bit (MSB) within a digital word, the first determining including:
connecting an input voltage to a first plurality of capacitors, the first plurality of capacitors including a plurality of main conversion capacitors, a plurality of sub-conversion capacitors, and a plurality of shared capacitors; and
connecting a reference voltage to a second plurality of capacitors, the second plurality of capacitors including a main conversion capacitor of the plurality of main conversion capacitors, and a first selected number of shared capacitors of the plurality of shared capacitors to generate a MSB DAC voltage; and
second determining a logic value for a least significant bit (LSB) within the digital word, the second determining including connecting the reference voltage to a second selected number of shared capacitors from the plurality of shared capacitors to generate a LSB DAC voltage.

13. The method of claim 12 wherein the first determining further includes comparing the MSB DAC voltage to a control voltage to generate a first comparison sign.

14. The method of claim 13 wherein the first determining further includes connecting the main conversion capacitor to ground, and the reference voltage to a next main conversion capacitor when the first comparison sign is positive.

15. The method of claim 14 and further comprising setting the MSB to a logic one when the comparison sign is negative, and setting the MSB to a logic zero when the comparison sign is positive.

16. The method of claim 15 and further comprising leaving the main conversion capacitor connected to the reference voltage, and connecting a next main conversion capacitor to the reference voltage when the first comparison sign is negative.

17. The method of claim 16 wherein the second determining further includes comparing the LSB DAC voltage to the control voltage to generate a second comparison sign.

18. The method of claim 17 wherein the second determining further includes setting the LSB to a logic one when the comparison sign is negative, and setting the LSB to a logic zero when the comparison sign is positive.

* * * * *